United States Patent [19]

Nishida et al.

[11] Patent Number: 5,095,330
[45] Date of Patent: Mar. 10, 1992

[54] APPARATUS AND METHOD FOR FORMING AN INTERMEDIATE ORIGINAL SHEET FOR PRINTING A BOOK

[75] Inventors: Fumihiko Nishida; Yasuhiro Satoh; Masatsugu Morikawa; Toshihiro Mitsui, all of Kyoto, Japan

[73] Assignee: Dainippon Screen Mfg. Co., Ltd., Kyoto, Japan

[21] Appl. No.: 370,652

[22] Filed: Jun. 23, 1989

[30] Foreign Application Priority Data

Jun. 28, 1988 [JP] Japan .................................. 63-159724
Mar. 7, 1989 [JP] Japan .................................... 1-54820

[51] Int. Cl.⁵ .............................................. G03B 27/62
[52] U.S. Cl. ........................................ 355/75; 355/77
[58] Field of Search ............................. 355/75, 88, 77

[56] References Cited

U.S. PATENT DOCUMENTS 4,382,676 5/1983 Ohta et al. .............................. 355/75
4,821,078 4/1989 Nishida et al. ......................... 355/75

Primary Examiner—Michael L. Gellner
Assistant Examiner—Khanh Dang
Attorney, Agent, or Firm—Lowe, Price, LeBlanc, Becker & Shur

[57] ABSTRACT

An apparatus is provided for forming a base sheet with a plurality of original films precisely stripped, i.e., affixed on it in a predetermined layout for use in a photomechanical process for printing a book. The apparatus includes a unit for receiving and storing information relating to a plurality of original films outputting position data of each of the plurality of original films to be affixed to the base sheet; a unit for forming register holes on each of the original films based on the position data; a unit for placing each of the original films in a predetermined position on the base sheets based on the register holes and the position data, and a unit for fixing each of the original films in its respective predetermined position on the base sheet. In another aspect of the invention there is provided a method for forming an intermediate original sheet using the above described apparatus and including the steps of operating each of the above mentioned units of such apparatus.

14 Claims, 22 Drawing Sheets

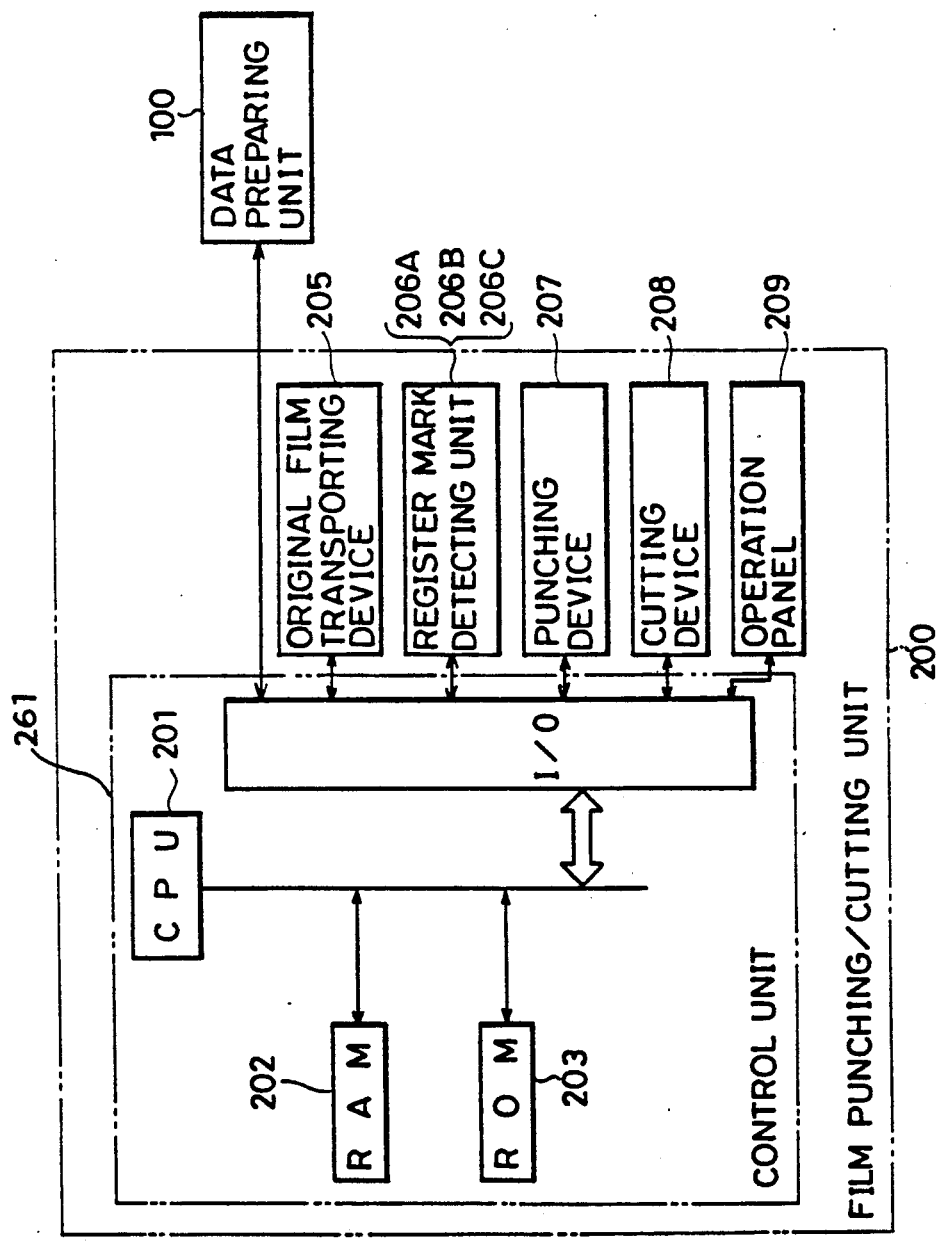

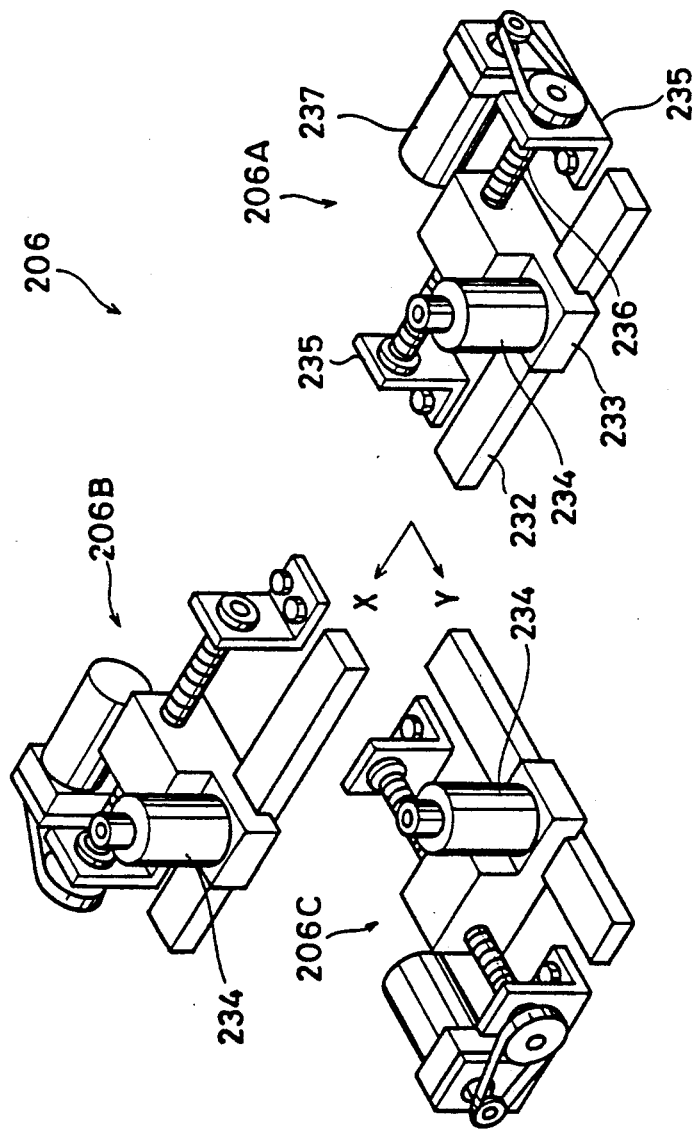

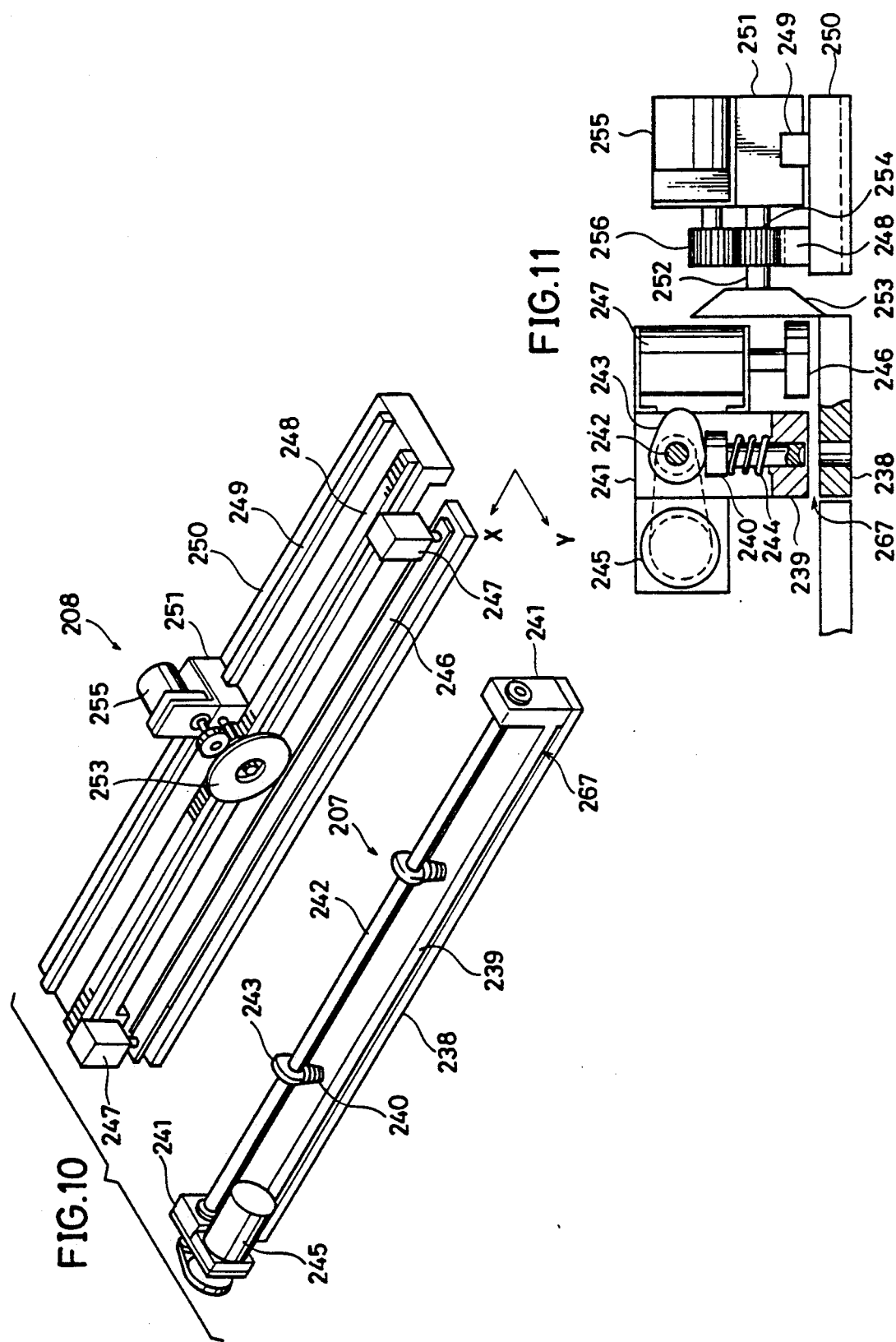

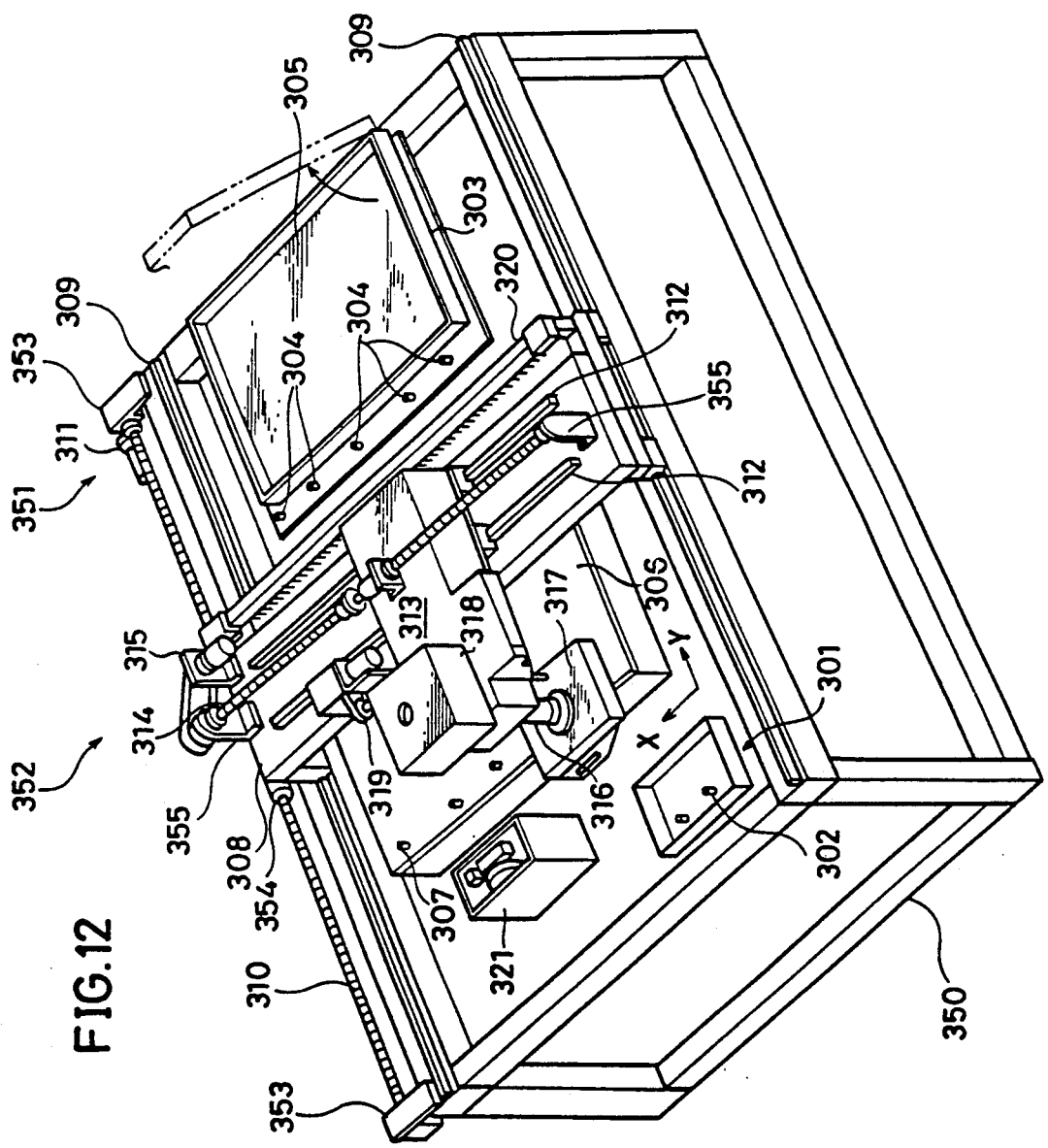

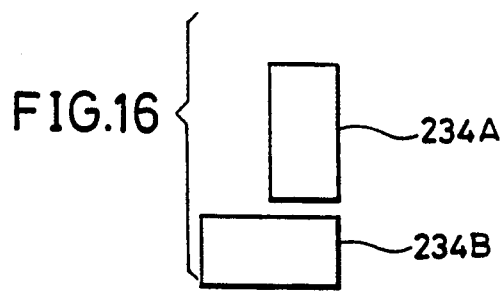
FIG. 16
FIG. 17(a)   FIG. 17(b)   FIG. 17(c)
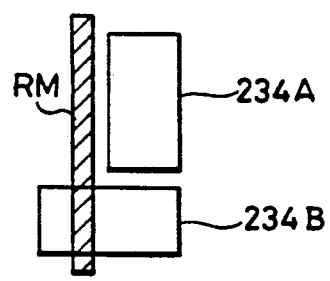 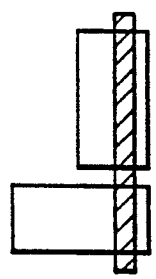 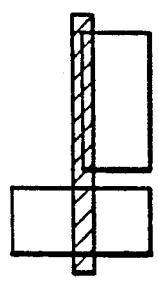
FIG. 18(a)   FIG. 18(b)
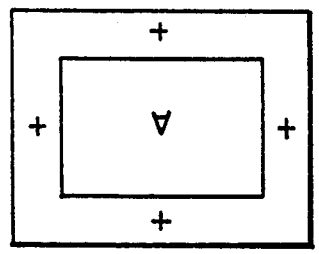 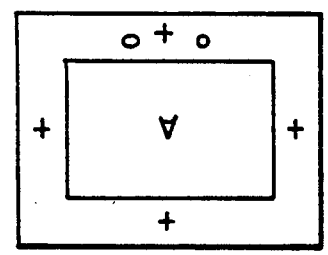
FIG. 18(c)   FIG. 18(d)
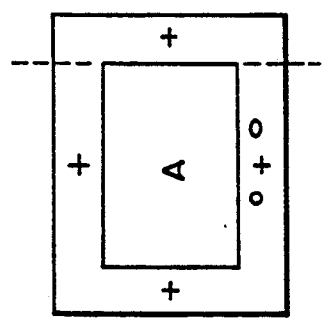 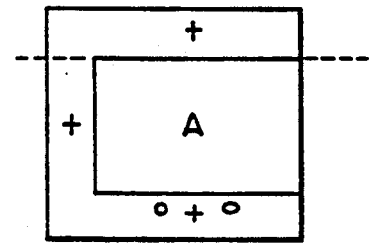

FIG. 26A
FIG. 26B
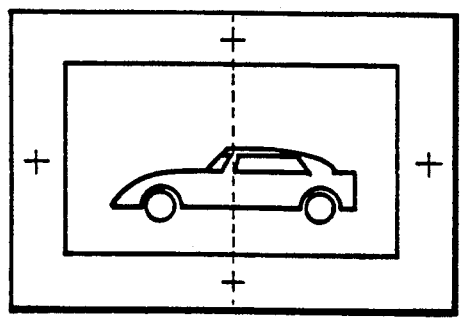
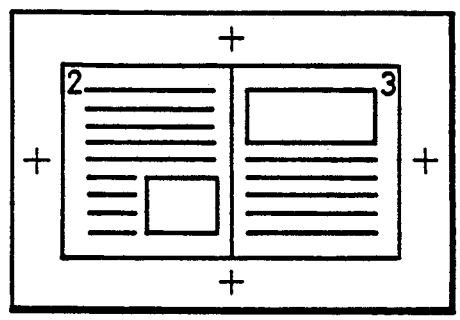
FIG. 27A
| 5 | 12 | 6 | 8 |
|---|----|---|---|
| 4 | 13 | 16 | 1 |
FIG. 27B
| 7 | 10 | 11 | 6 |
|---|----|----|---|
| 2 | 15 | 14 | 3 |
FIG. 27C
| 21 | 28 | 25 | 24 |
|----|----|----|----|
| 20 | 29 | 32 | 17 |
FIG. 27D
| 23 | 26 | 27 | 22 |
|----|----|----|----|
| 18 | 31 | 30 | 19 |
FIG. 28
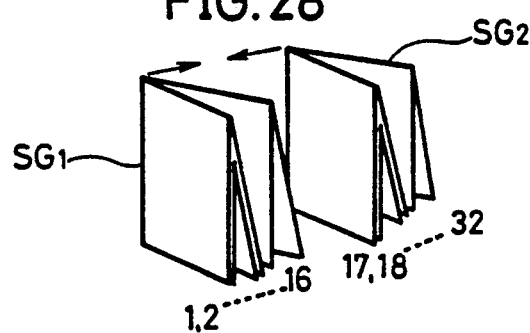

APPARATUS AND METHOD FOR FORMING AN INTERMEDIATE ORIGINAL SHEET FOR PRINTING A BOOK

BACKGROUND OF THE INVENTION

1. Field of the Invention

The present invention relates to an apparatus and a method for forming an intermediate original sheet (a transparent sheet with original films arranged fixed on it being in a desired layout, to be utilized for manufacturing a printing plate by a photographic method) required in intermediate steps of a photomechanical process.

2. Description of the Background Art

In a process of making a book, each of a number of printing sheets typically includes a plurality of pages printed in a prescribed layout. Each printing sheet is folded to be what is known as a signature. A plurality of signatures are gathered for binding. A bound book is trimmed for size adjustment and thus the respective pages of the signatures are separated from each other.

It is necessary to arrange and print the plural pages on a printing sheet so that they are lined up each in a correct order and in a correct direction after the folding. In a process of printing a book, an original film corresponding to each page has an image of a common standardized size such as A4 or A3. In a prepress process of forming a printing sheet, a plurality of original films of a standard size are stripped on a base sheet. The layout of the original films should take into account the later formation of the signature. In the following, procedures for stripping original films on a base sheet will be described. The base sheet on which the original films are stripped is referred to hereinafter as an "intermediate original sheet."

(1) Determination of a Layout of the Original Films

Referring to FIG. 1A, in the case of stripping four two sided pages, individual pages 1, 4, 5 and 8 of a book for example are printed on one surface of a printing sheet. Referring to FIG. 1B, pages 2, 3, 6 and 7 of the book are printed on the reverse surface of the printing sheet.

Referring to FIGS. 1A and 1B, note that page 2 is located on the reverse of the page 1, page 3 is located on the reverse of the page 4, page 6 is located on the reverse of the page 5, page 7 is located on the reverse of the page 8. The pages 3, 4, 5 and 6 are printed upside down with respect to pages 2, 1, 8 and 7, respectively.

Referring to FIG. 1C, when the above-mentioned printing sheet is folded, the respective pages are lined up in the correct order in the correct direction. The number of pages on the printing sheet, or the order of folding differs dependent on the dimensions of the printing machines or the kind of binding. Accordingly, the layout of the pages printed on the printing sheet differs dependent on those restrictions. The operator who strips the pages determines the arrangement of the original films of the respective pages on the base sheet based on the layout of the page. The determination of the arrangement includes positioning and angling of the original film of each page to be stripped on the base sheet.

(2) Cutting of Unnecessary Portions of the Original Films

Generally, an image of a page is formed on a central area of an original film. Accordingly, there exist portions without any image formed thereon around the image. The original film normally has a rectangular form larger than the size of the image. Register marks for positioning are printed on the portions of the original film where the image is not formed (unnecessary portions). The unnecessary portions of each original film should not be stripped in being overlapped with other original films. In order to avoid such overlapping, the unnecessary portions are cut in advance.

A margin of several millimeters is sometimes set between the adjacent images of the pages on the base sheet. This margin is called a gutter. Referring to FIG. 2, four original films OF1 to OF4 are stripped on a base sheet BS. A spacing Xl is provided as a gutter between the images of the original films OF1 and OF2. A gutter of the same spacing is also provided between the images of the original films OF3 and OF4. A gutter of a spacing Yl is provided between the images of the original films OF1 and OF3, and between the images of the original films OF2 and OF4.

In the above described layout, portions to overlap with the adjacent original films out of the unnecessary portions of the respective original films OF1 to OF4 are cut manually so that the above-mentioned gutters are formed. Referring to FIG. 3, for example in the case of the original film OF1, the hatched portions are cut out of the unnecessary portions of the original film OF1.

If no gutter is set, Xl and Yl are both zero. In other words, the portions adjacent to the respective other original films out of the unnecessary portions of the films are entirely cut.

(3) Registration and Stripping of Original Films on a Base Sheet

Referring to FIG. 3, register marks RM1 to RM4 for registration are formed on peripheral portions of the original film. Reference marks to be coincident with the register marks RM1 to RM4 are provided on a transparent base sheet BS (such as those shown in FIGS. 2 and 4). The reference marks are sometimes given on layout paper on which the transparent base sheet is placed.

The operator arranges the respective original films on the base sheet according to the above-mentioned layout by visually confirming coincidence between the register marks RM1 to RM4 and the reference marks on the base sheet. The original films thus arranged are fixed on the base sheet by an adhesive tape or the like.

As a result of the operations of (1) to (3), the stripping of the original films on the base sheet for forming a printing sheet is completed. In the case of monochromatic printing, a plate for the monochromatic printing may be prepared from the base sheet thus completed.

In the case of color printing, it is necessary to effect the stripping on the base sheet for each color separation (normally, for each of yellow (Y), magenta (M), cyan (C) and black (Bk)). Stripping of original films by manual operation as described above takes time and labor. In practice, original films are typically stripped for each color according to the following procedures. The following method and the apparatus used for that method are described for example in U.S. patent application Ser. No. 20334 filed by Nishida et al, entitled "An apparatus for Composing a Plurality of Original Films on a Base Sheet".

Original films for any one of the four colors Y, M, C and Bk are manually stripped on a base sheet, so that a master sheet is formed. The arrangement of the original films on the master sheet is read in by a computer as numerical data, utilizing a digitizer or the like. The original films for the remaining three colors are stripped on base sheets for the respective color separations based on the read numerical data. Since the apparatus for automatically stripping the original films on the base sheet based on the numerical data is disclosed in the above mentioned application, a detailed description thereof is not repeated here.

The master sheet and the three base sheets on which the original films of the respective colors are stripped based on the numerical data read from the master sheet constitute a complete set of printing sheets for the four color separations for color printing.

The reading of the numerical data from the master sheet by using a digitizer or the like usually includes some error. There is a small deviation between the arrangement of the original films on the master sheet and the arrangements on the other three base sheets, due to input error by the digitizer. If color printing is effected based on those base sheets, defective printing may occur due to color deviation. In many cases, the original films on the master sheet are temporarily removed and stripped again on a base sheet by the apparatus for automatically stripping the original films on the base sheet in the same manner as in the other three colors. Thus, the arrangements of the original films on the base sheets of the four colors coincide with each other.

However, it is pointed out that the conventional techniques involve disadvantages as described below at the time of stripping original films on base sheets.

One of the disadvantages is that in the case of manual stripping on a master sheet, the stripping accuracy cannot be maintained at a preferable level. As shown in FIG. 3, if two register marks RM3 and RM4 out of the four register marks are cut off, registration is effected only by using the remaining register marks RM1 and RM2. In such a case, the accuracy of registration is lowered as a matter of course compared with the case of using the four register marks including the marks RM3 and RM4. The quality of a printing sheet is lowered due to color deviation.

FIG. 4 shows the most unfavorable case. If original films of eight pages are stripped on a base sheet BS, each of the original films OF2, OF3, OF6 and OF7 arranged at the center has three sides to be cut, adjacent to other original films. A register mark is left only on the remaining side of each original film. It is practically impossible to position each original film with accuracy by using only one register mark. Therefore, the accuracy of registration is considerably lowered.

Another disadvantage is that work for preparing original films to be stripped takes much time. Although the operation for stripping original films is carried out automatically, operation for cutting original films according to a layout is carried out manually. Since heads and tails of the respective pages, i.e., are not constantly fixed, it is necessary to confirm the portions to be cut for each page by taking account of the layout at the time of cutting the original films. This operation not only fatigues the operator but also takes much time.

A further disadvantage is that an inexperienced operator cannot strip original films with precision according to the conventional stripping techniques. Stripping on a master sheet needs to be carried out manually. An inexperienced operator might prepare a master sheet with inaccuracy. Since stripping on a base sheet for each of the other three colors is effected based on the master sheet, the quality of a printed matter obtained would be lowered.

SUMMARY OF THE INVENTION

A principal object of the present invention therefore, is to provide a method and an apparatus for forming an intermediate original sheet rapidly and easily in a photomechanical process for printing a book, including a plurality of original films stripped on a base sheet with a predetermined precision.

According to one aspect of the present invention, the intermediate original sheet forming apparatus includes: a position data output unit for outputting position data of a plurality of original films on a base sheet; a register hole forming unit for forming register holes for determining the position of each original film based on the position data; a cutting unit for cutting off the unnecessary portions of the original films based on the position data; a registering unit for determining positions of the plurality of original films on the base sheet; and a fixing unit for fixing each original film on the base sheet at the determined position.

The intermediate original sheet forming apparatus according to the present invention has the above-described structure. The position data output unit defines an arrangement of a plurality of original films on a base sheet and outputs position data. The position data include, other than the data for positioning the original films on the base sheet, the cutting position data for specifying the portions to be cut off from the original films and the punching data for defining the positions of the register holes. The register hole forming unit forms register holes on the original films based on the position data. The cutting unit cuts off the unnecessary peripheral portions specified by the cutting position data. The registering unit places the original films previously mounted on the supplying position by utilizing the register holes at predetermined positions on the base sheet by using the position data and the register holes. The fixing unit fixes the original films to the base sheet at the predetermined positions. Manual and time-consuming work such as visual confirmation for registration of original films is not required. Thus, stripping of the original films is carried out rapidly. The preparation of the position data does not involve any skill-requiring work, such as manual preparation of a master sheet. Accordingly, an inexperienced operator can easily form an intermediate original sheet.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a block diagram of the punching/cutting unit according to the preferred embodiment of the invention.

FIG. 9 is a perspective view of a register mark detecting device in the preferred embodiment of the invention.

FIGS. 10A and 10B are respective partial fragmentary perspective views of a punching device as and a cutting device used in preferred embodiment of the invention.

FIG. 11 is a partial side sectional view of the punching device and cutting device shown in FIG. 10.

FIG. 12 is a perspective view of an original film stripping unit for use in the preferred embodiment of the invention, with its cover removed.

FIG. 16 is a schematic view of an arrangement of optical sensors of a register mark detecting device.

FIG. 17 (a)-(c) represents schematic views illustrating reading of a register mark by the optical sensors.

FIG. 18 (a)-(d) represents schematic plan views of an original film showing formation of register holes of the original film and cutting of unnecessary portions in the embodiment of the invention.

FIGS. 26A and 26B are schematic views of double size original films.

FIGS. 27A to 27D are schematic illustrations of the pages on the base sheets.

FIG. 28 is a schematic view of the signatures to be side-stitched together.

DESCRIPTION OF THE PREFERRED EMBODIMENTS

First Embodiment

Figures 1A, 1B, 1C:
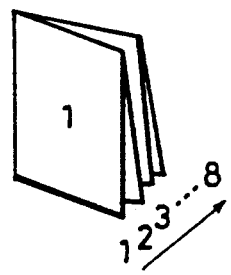
FIGS. 1A to 1C are schematic views showing a process of forming a signature.
Figure 2:
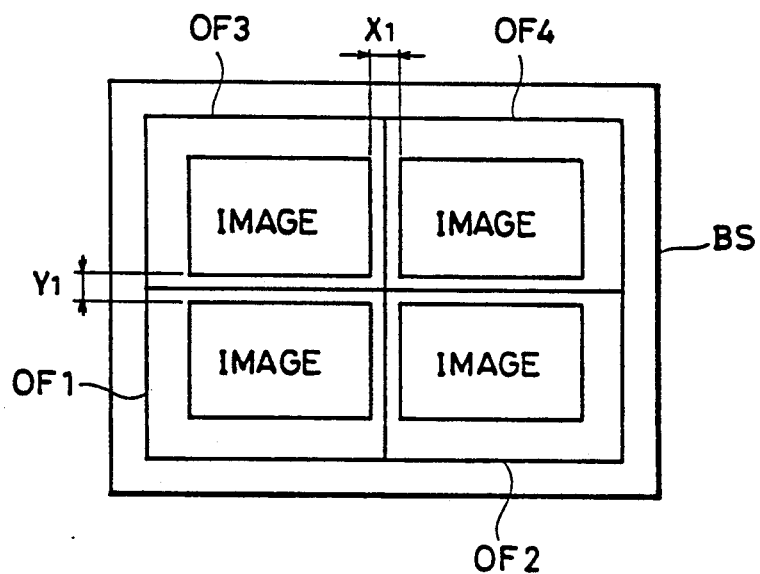
FIG. 2 is a plan view of an intermediate original sheet for explaining gutters set between respective pages.
Figure 3:
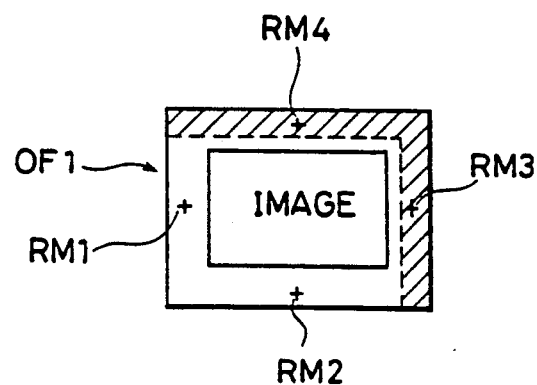
FIG. 3 is a plan view of an original film showing a relation between the peripheral regions to be cut and the register marks.
Figure 4:
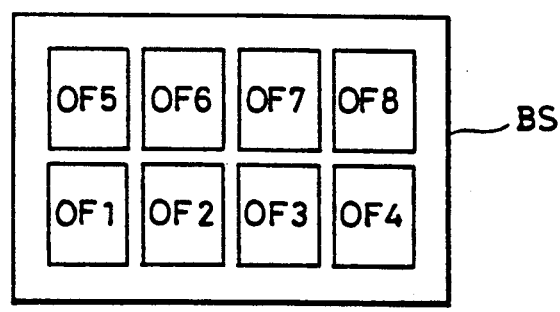
FIG. 4 is a plan view of an intermediate original sheet to illustrate disadvantages of the prior art, in which eight original films are arranged on a base sheet.
Figure 5:
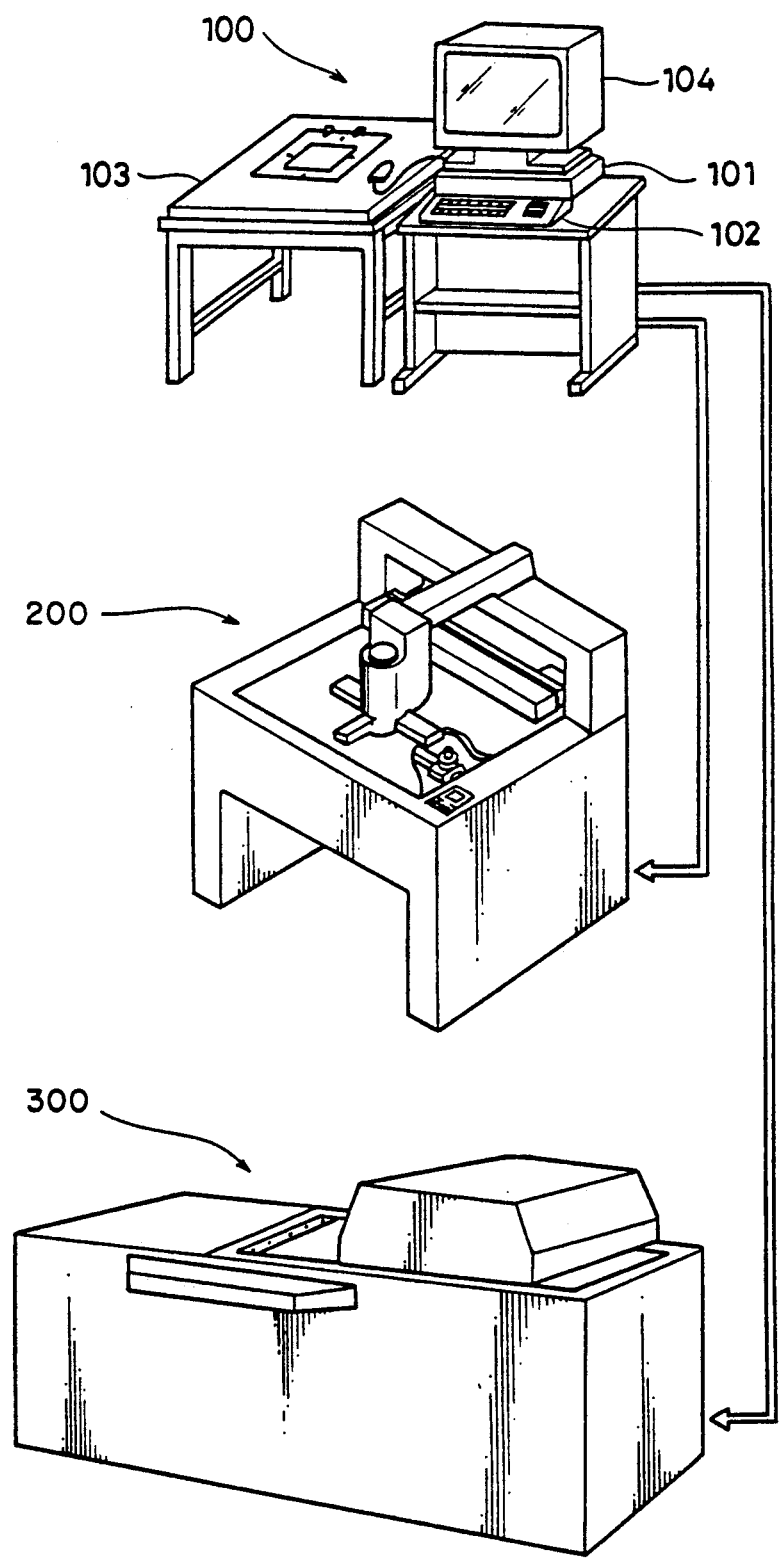
FIG. 5 is a perspective view of a preferred embodiment of an intermediate original sheet forming apparatus according to the present invention.

Referring to FIG. 5, an intermediate original sheet forming apparatus according to the first embodiment of the invention comprises: a data preparing unit 100 which receives a stripping layout and necessary data of stripped original films, prepares punching/cutting data for defining positions of holes formed for registration in the original films and positions of cutting of predetermined sides to conform the original films to the layout, and prepares stripping data representing the arrangement of the original films on the base sheet; a film punching/cutting unit 200 connected to the data preparing unit 100, which receives the punching/cutting data, forms the holes in the original films and cuts the predetermined sides of the original films; and an original film stripping unit 300 connected to the data preparing unit 100, which receives the stripping data, arranges and strips the original films processed by the punching/cutting unit 200, in predetermined positions and in predetermined directions on the base sheet.

The data preparing unit 100 comprises: a microcomputer 101 which is a computer capable of receiving a designation of a layout of original films from the operator interactively and which manages the interactive process, calculates the punching/cutting data and the stripping data based on the layout designated by the operator and outputs the same; a keyboard 102 for inputting data or instructions to the microcomputer 101 by the operator; a digitizer 103 for simply designating a layout of original films on a base sheet and the original film size and so on; and a CRT 104 for displaying predetermined information from the microcomputer 101. It is to be noted that the apparatus according to the present invention is provided to realize an arrangement of original films conforming to a predetermined standard, as in the case of printing a book. A plurality of typical layouts are stored in the storing portion of the microcomputer 101. Accordingly, in the case of using only the stored layouts, a means such as a digitizer, for directly designating a layout and inputting other information, is not necessarily required.

Figure 6:
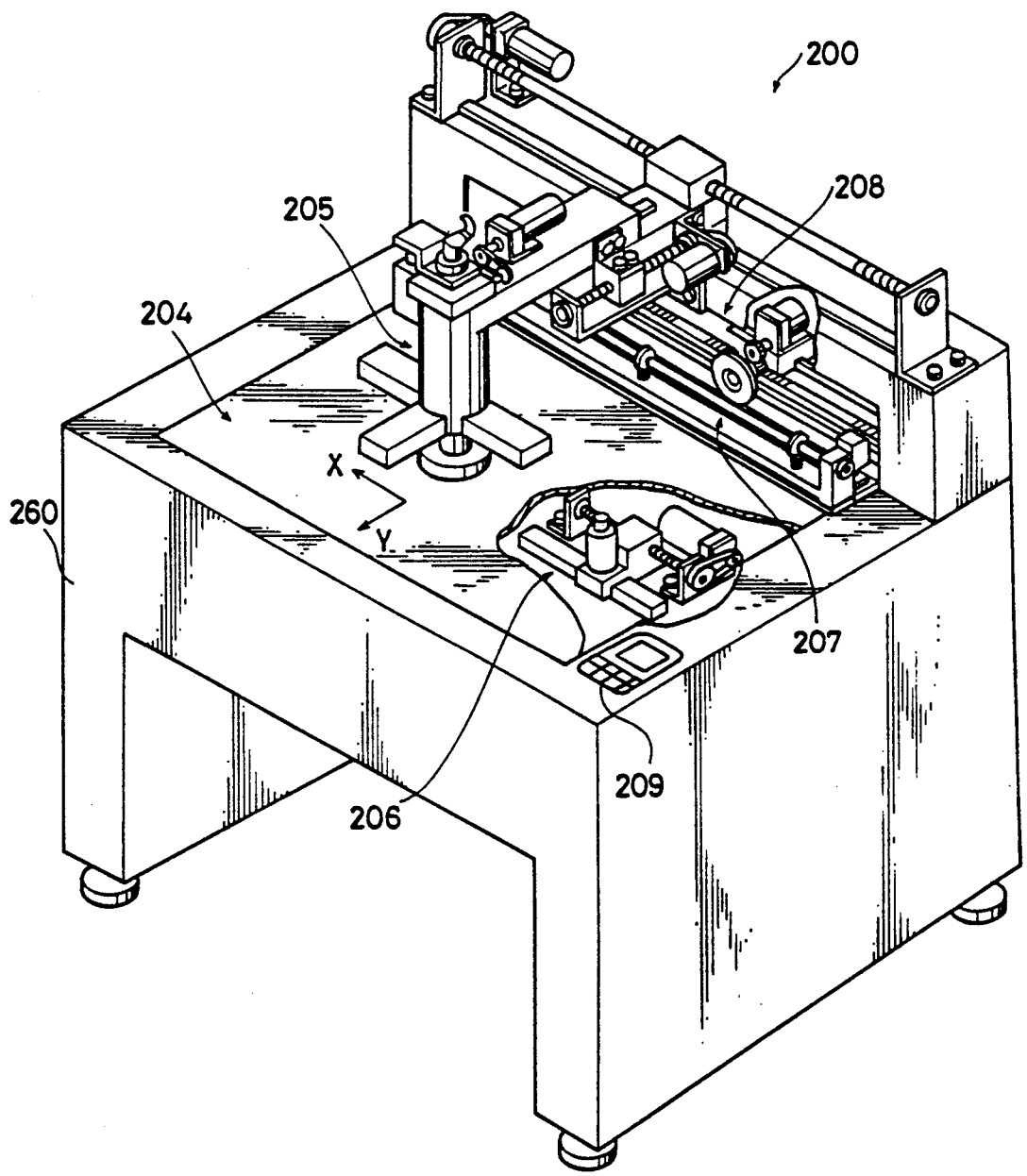
FIG. 6 is a partial fragmentary perspective view of an original film punching/cutting unit in the embodiment of the present invention per FIG. 5.

Referring to FIG. 6, the punching/cutting unit 200 comprises: a base frame 260 placed stably on a floor; a glass table 204 provided on an upper portion of the base frame 260, having an upper surface on which an original film is placed; an original film transport device 205 provided on the base frame 260, for holding an original film in parallel with the glass table 204, transporting the original film to a predetermined position on the glass table 204, rotating the original film around an axis vertical to the surface of the glass table 204 and placing the original film on the glass table 204; a punching device 207 provided in a rear portion of the upper surface of the base frame 260, for punching register holes in the original film, to be used in mounting the films on the supplying positions on the unit 300; a cutting device 208 for cutting off unnecessary side portions of the original film; a register mark detecting device 206 provided under the glass table 204, for detecting the register marks provided on the original film; and a control unit 261 (not shown in FIG. 6) to be operated by the operator by using an operation panel 209, provided in a right front portion on the upper surface of the base frame 260, for controlling the transport device 205, the punching device 207, the cutting device 208 and the detecting device 206, those devices being referred to hereinafter as peripheral devices.

Figure 6A:
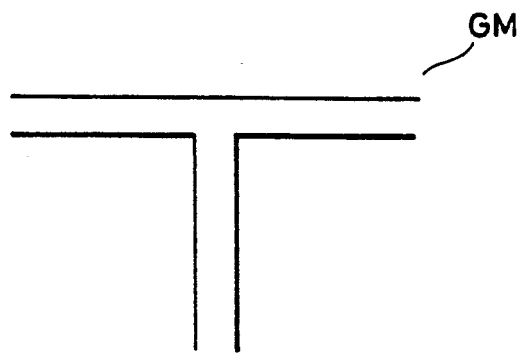
FIG. 6A is a schematic illustration of a gauge mark.
Figure 6B:
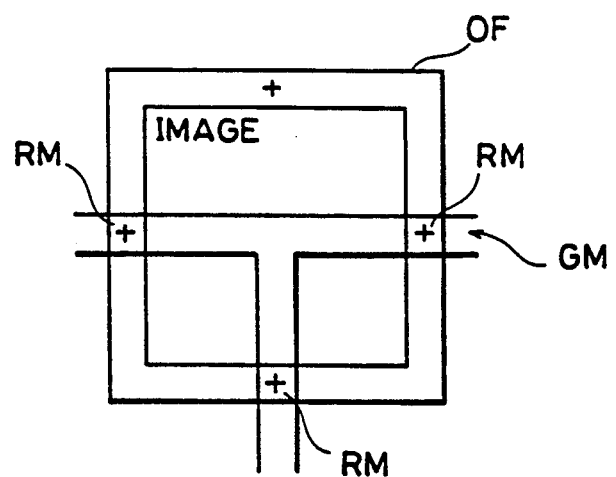
FIG. 6B is a schematic illustration of the positioning of the original film upon an gauge mark.

Referring to FIG. 6A, in a predetermined position of the upper surface of the glass table 204 is provided a gauge mark GM. The gauge mark GM includes three lines with the spacing of about 5 mm thereof, forming a thick T-shape. The gauge mark GM defines the start position where the original film OF to be supplied to the unit 200 is placed by the operator.

Referring to FIG. 7, the control unit 261 comprises: a central processing unit (CPU) 201 for executing a predetermined program for controlling the peripheral devices in order to process original films according to a predetermined layout, based on the punching/cutting data transferred from the data preparing unit 100; an input/output interface I/O for connecting the CPU 201 to the data preparing unit 100, the peripheral devices and the operation panel 209; a random access memory (RAM) 202 connected to the CPU 201, for storing the punching/cutting data transferred from the data preparing unit 100 and other necessary data for the execution of the program; and a read only memory (ROM) 203 connected to the CPU 201, for storing information not required to be rewritten, such as the program to be executed by the CPU 201.

Figure 8:
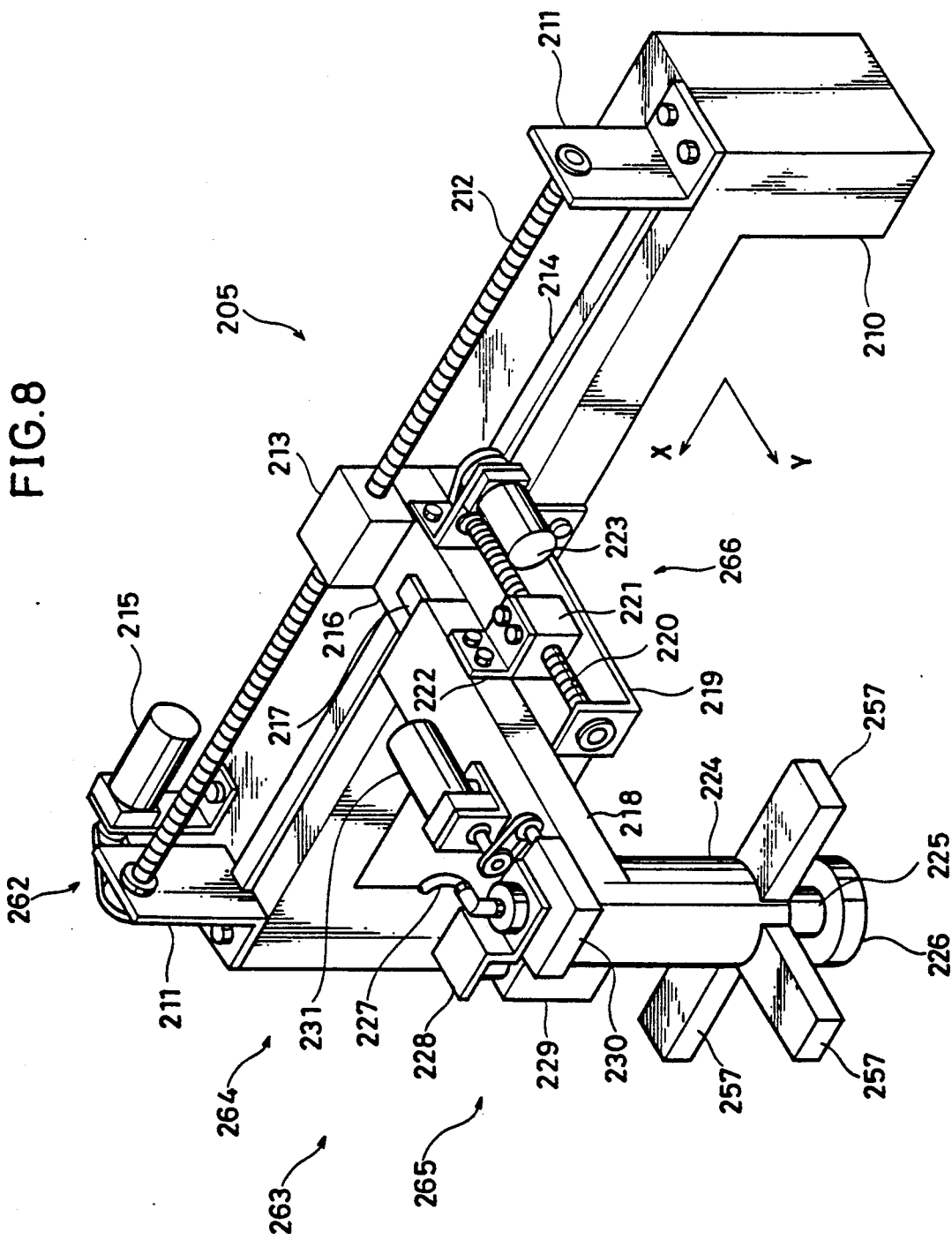
FIG. 8 is a perspective view of an original film transport device on the punching/cutting unit in the preferred embodiment.

Referring to FIG. 8, the original film transport device 205 comprises: a cross girder 210 provided on a rear portion of the upper surface of the base frame 260 and extending over the glass table 204; a transverse moving member holder 262 provided on the cross girder 210, for holding a transverse moving member 213 and moving the same in the length direction (the X direction) of the cross girder 210; and a head member 263 fixed to the transverse moving member 213 and projecting forward (in the Y direction) over the glass table 204 for holding an original film.

The transverse moving member holder 262 comprises: a pair of opposing bearings 211 provided at respective ends of a moving range of the transverse moving member 213, at both ends of the cross girder 210 along its length; a screw shaft 212 supported rotatably at both ends by the bearings 211; a pulse motor 215 coupled operationally with the screw shaft 212, for rotating the screw shaft 212; and a guide rail 214 provided on an upper surface of the cross girder 210, for guiding transverse movement of the transverse moving member 213. The transverse moving member 213 has a screw hole engaging with the screw shaft 212, whereby the transverse moving member 213 is held by the screw shaft 212.

The head unit 263 comprises: a support arm 216 having an upper surface at one end fixed to the transverse moving member 213 and a lower surface engaging with the guide rail 214, sliding on the guide rail 214 together with the movement of the transverse moving member 213 and projecting forward; a head arm 218 provided on the support arm 216 slidably in the Y direction; a head holder 224 provided at a top end of the head arm 218, having a cylindrical form extending under the head arm 218 and being provided with a hole (not shown) penetrating from its upper surface to its lower surface; a rod 225 inserted slidably in the vertical direction into the hole of the head holder 224; a vacuum head 226 of a disk form having on its lower surface a plurality of absorption grooves not shown and holding an original film by absorption force in parallel with the glass table 204; a head rotating device 264 provided on an upper surface of the head arm 218, for rotating the vacuum head 226 and the rod 225 around its axis; a head elevating device 265 provided on a side portion of the head arm 218, for holding an upper end of the rod 225 and moving vertically the rod 225 and the head 226; and a head arm drive device 266 provided on a side portion of the support arm 216, for moving the head arm 218 in the Y direction.

A guide rail 217 is provided on the upper surface of the support arm 216, and the head arm 218 engages with the guide rail 217 slidably. The head arm drive device 266 comprises: bracket bearings 219 fixed to a side surface of the support arm; a screw shaft 220 supported rotatably at both ends thereof by the bracket bearings 219; a back-and-forth moving member having a screw hole engaging with the screw shaft 220; an L-shaped metallic member 222 having one end fixed to the head arm 218 and the other end fixed to the transverse moving member 221, for engaging the head arm 218 with the member 221; and a pulse motor 223 coupled operationally with the screw shaft 220, for rotating the screw shaft 220 and moving the member 221 along the shaft 220.

An air absorbing path (not shown) communicating with vacuum channels (not shown) in the vacuum head 226 is provided in the rod 225. The air absorbing path is connected with an absorption tube 227 at the upper end of the rod 225. The absorption tube 227 is connected with a vacuum pump (not shown).

The head rotating device 264 comprises: a pulse motor 231 fixed on the upper surface of the head arm 218; and a gear box 230 connected operationally with the pulse motor 231, coupled to a projecting portion of the rod 225 on the head holder 224 and fixed to the head holder 224. The rod..-225 rotates around its axis driven by the cooperation of the pulse motor 231 and the gear box 230.

The head elevating device 265 comprises: an attachment 228 provided at an upper end of the rod 225 and projecting over a side portion of the head arm 218; and an air cylinder 229 fixed on the side portion of the head arm 218 below the attachment 228, and contacting the attachment 228 from below. By the operation of the air cylinder 229, the rod 225 and the vacuum head 226 at the end of the rod 225 move vertically.

Light sources 257 are provided in a lower portion of the head holder 224. The light sources 257 illuminates an original film when the register mark detecting device 206 detects optically the register marks of the original film held by the vacuum head 226.

Referring to FIG. 9, the register mark detecting device 206 comprises: a first register mark detecting device 206A and a second register detecting device 206B provided under the glass table 204, opposite to each other in the X direction; and a third register mark detecting device 206C located at an intermediate position between the first and second register mark detecting devices 206A and 206B and provided in a front portion under the glass table 204.

The first detecting device 206A is provided under the glass table 204 and on a base plate (not shown) parallel to the table 204, for example. Guide rails 232 are provided on the base plate. The first detecting device 206A includes: a support block 233 engaged slidably with the guide rail 232 and having a screw hole; an optical sensor 234 directed upward and fixed on the support block 233; a pair of bearings 235 provided on the base plate oppositely to each other at both ends of the travelling range of the support block 233; a screw shaft 236 supported rotatably at both ends thereof by the pair of bearings 235 and engaged with the screw hole of the support block 233; and a pulse motor 237 fixed on the base plate and coupled operationally with the screw shaft 236 by pulleys and a rubber belt or the like. The screw shaft 236 rotates according to the rotation of the pulse motor 237. The engagement between the screw shaft 236 and the screw hole of the support block 233 enables the block 233 and the optical sensor 234 thereon to move along the guide rail 232 within a range defined by the pair of bearing 235.

The other detecting devices 206B and 206C have the same structure as described above. The optical sensor 234 of the second detecting device 206B is movable along the X direction in the same manner as that of the first detecting device 206A. The optical sensor 234 of the third detecting device 206C is movable along the Y direction.

Referring to FIGS. 10A, 10B and 11, structures of the punching device 207 and the cutting device 208 will be described. It is to be noted that the punching device 207 and the cutting device 208 are represented separately in FIGS. 10A and 10B, respectively, for the purpose of facilitating the understanding although they are, in practice, formed integrally.

The punching device 207 includes: a die 238 having an upper surface almost at the same level as the upper surface of the glass table 204; a punch guide 239 having bearings 241 integrally formed at its opposite ends and disposed in parallel to the die 238 with a gap 267 through which an original film passes; two punches 240 disposed at predetermined positions of the punch guide 239, and having respective lower ends for opening holes in the original film inserted in the gap 267; a cam shaft 242 with its both ends supported rotatably by a pair of bearings 241 disposed over the punch guide 239, in parallel with the guide 239; and a pulse motor 245 fixed to one of the pair of bearings 241 and coupled operationally with the cam shaft 242. The punches 240 are inserted into through-holes formed in the punch guide 239 and are spring biased at upper portions by compression coil springs 244 provided between their respective heads and the punch guide 239.

Eccentric cams 243 for the respective punches 240 are fixed at corresponding portions of the cam shaft 242 and are in contact with the respective heads of the punches 240. When the cam shaft 242 rotates, the eccentric cams 243 rotate so that the punches 240 move vertically.

The cutting device 208 includes: a pair of air cylinders 247 directed downward and fixed on respective rear surfaces of the bearings 241; a presser plate 246 with its under surface in parallel with the upper surface of the punch guide 238 held by means of the pair of air cylinders 247, for pressing the original film inserted in the gap 267 against the punch guide 238; a base plate 250 provided along the punch guide 238; a rack 248 and a guide rail 249 being provided on the base plate 250, in parallel with the presser plate 246; a cutter holder 251 engaged slidably with the guide rail 249; a cutter shaft 252 with its one end rotatably supported by the cutter holder 251; a rotating cutter 253 provided at another end of the cutter shaft 252, for cutting off unnecessary side portions of the original film; a pinion gear 254 provided on the cylindrical portion of the rotating shaft 252, and engaged with the rack 248; a motor 255 fixed on the cutter holder 251; and a drive gear 256 provided at a top end of the rotating shaft of the motor 255 and engaged with the pinion gear 254. When the motor 255 is operated, the rotating force is transmitted to the pinion gear 254 through the drive gear 256 so that the pinion gear 254 rotates. The rotating cutter 253 engages with the rack 248 to move along the X direction in parallel with the guide rail 249 while rotating.

The film punching/cutting unit 200 punches holes in predetermined positions of the original film by means of the punches 240 and cuts the unnecessary portions of the original film by means of the rotating cutter 253.

Referring to FIG. 12, the original film stripping unit 300 comprises: a base frame 350 having a pair of parallel guide rails 309 provided on two opposing sides of its upper surface; an original film set table 301 on which an original film punched and cut by the film punching/cutting unit 200 is placed and which defines a reference position of arrangement of the original film to be stripped; a base sheet supplying portion 303 for supplying a base sheet on which originals are to be stripped; a base sheet tray 305 provided on the base sheet supplying portion 303 and coupled to the base frame 350 rotatably in the direction shown by the arrow, on which the base sheets are stacked after stripping of the original films; a stripping table 306 on which a base sheet is placed and original films are stripped thereon; a cross girder 308 placed slidably on two guide rails 309 and crossing over the stripping table 306; a cross girder drive device 351 for sliding the cross girder 308 on the guide rails 309; an original film transport device 352 for holding and transporting the original film in the X direction along the cross girder 308, rotating the original film within a plane parallel to the upper surface of the stripping table 306 and moving vertically the original film in the direction vertical to the upper surface of the table 306; and a base sheet carrier 320 fixed to the cross girder 308, for carrying the base sheet.

The original film set table 301 has, on its upper surface, two pins 302 inserted in two register holes provided in the original film for holding the original film and defining its initial position.

The supplying portion 303 has a plurality of pins 304 projecting upward. Base sheets are provided with register holes in advance corresponding to the arrangement of the pins 304. A plurality of base sheets are stacked and aligned by the pins 304. The stripping table 306 has a plurality of base sheet registering pins 307 on its upper surface.

A supplied base sheet is set in a predetermined position for stripping when the pins 307 are inserted in the register holes of the base sheet. A plurality of vacuum channels (not shown) are provided on the upper surface of the stripping table 306 and the base sheet placed on the vacuum channels is fixed by the suction.

The cross girder drive device 351 comprises a pair of bearings 353 provided opposite to each other at both ends of one of the guide rails 309; a screw shaft 310 supported rotatably at both ends thereof by the pair of bearings 353; and a motor 311 fixed to one of the bearings 353 and coupled operationally to the screw shaft 310. A cylindrical member 354 engaged with the screw shaft 310 is fixed to an end of the cross girder 308 on the side of the drive device 351. The cross girder 308 slides on the guide rails 309 driven by the rotation of the screw shaft 310.

The original film transport device 352 comprises: a pair of guide rails 312 parallel to each other provided on the upper, surface of the cross girder 308, extending along the Y direction perpendicular to the guide rail 309; a pair of bearings 355 provided opposite to each other at both ends of the cross girder 308; a screw shaft 314 supported rotatably at both ends thereof by the pair of bearings 355; a motor 315 provided on the upper surface of the cross girder 308 near one of the bearings 355 and coupled operationally to the screw shaft 314; and a stripping head holder 313 having an upper portion engaging with the screw shaft 314 and a lower portion engaging slidably with the pair of guide rails 312, for holding an original film.

The head holder 313 includes: a rod 316 provided at its top end and movable vertically; a stripping head 317 provided at the lower end of the rod 316, for holding an original film; a gear box 318 coupled to an upper portion of the rod 316; and a pulse motor 319 coupled operationally to the gear box 318 and fixed to the head holder 313. The stripping head 317 is driven by an elevator (not shown) and moves vertically. The rod 316 is driven by the pulse motor 319 through the gear box 318 and rotates around its axis. Accordingly, an angle of the stripping head 317 around the axis of the rod 316 can be adjusted freely.

The base sheet carrier 320 is attached to the cross girder 308 movably in the vertical direction and a lower portion of the carrier 320 has an vacuum device or the like, (not shown) for holding a base sheet by suction.

The original film stripping unit 300 further comprises an adhesive tape supplying portion 321 provided in a predetermined position of the upper surface of the base frame 350, for putting a double-adhesive tape cut in a fixed length for stripping, on a reverse surface of an original film.

Vacuum channels (not shown) for holding an original film by suction are provided on the lower surface of the stripping head 317. The vacuum channels are connected to the vacuum channel device (not shown).

The head 317 has preferably a size larger than an original used. If original films vary in its size, a device for selecting the length of the vacuum channels of the head 317 according to the size of the original film is preferably provided so that operation can be carried out smoothly.

Figure 12A:
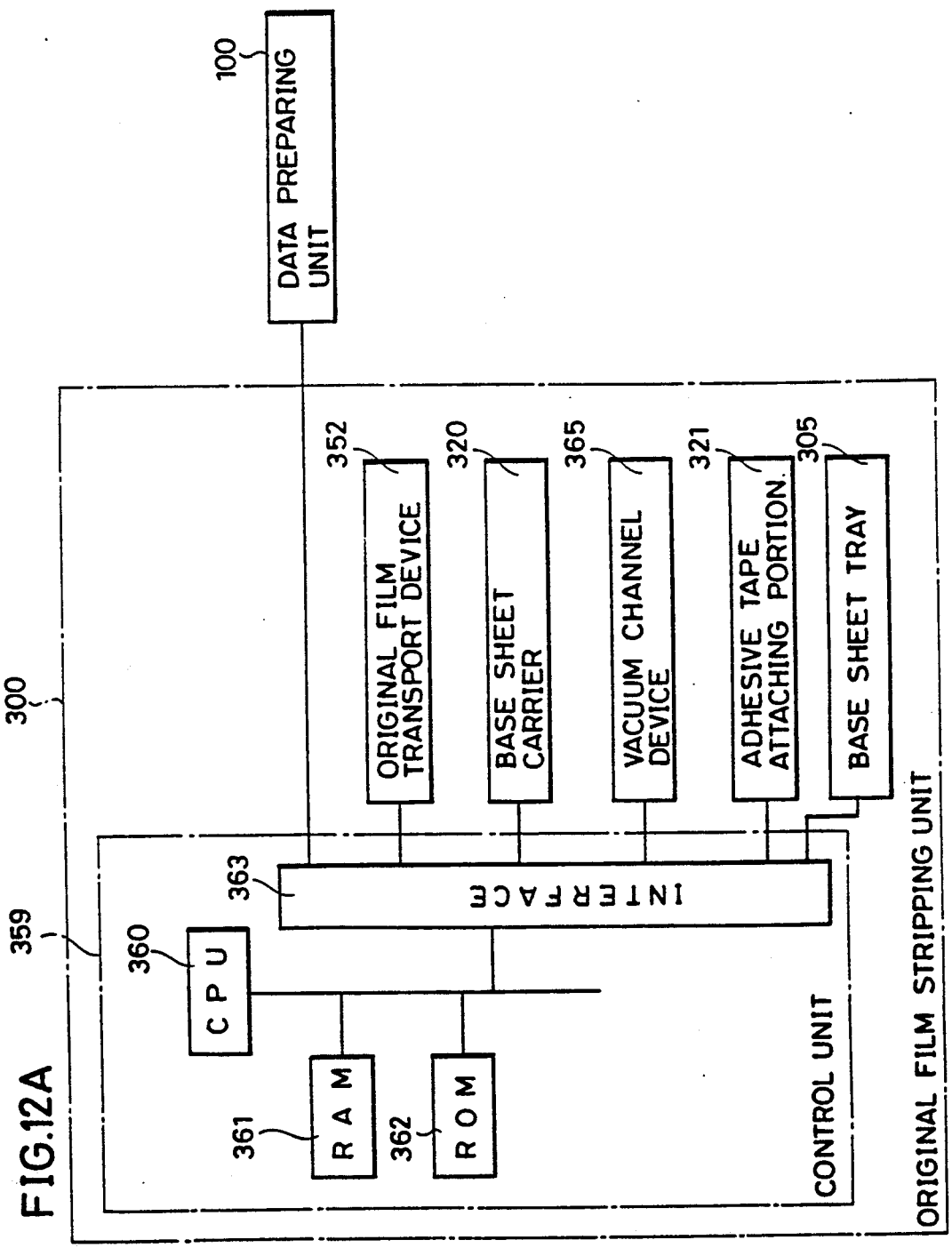
FIG. 12A is a block diagram of the original film stripping unit for use in the preferred embodiment of the invention.

FIG. 12A is a block diagram of the original film stripping unit 300. Referring to FIG. 12A, the unit 300 comprises: a control unit 359 for receiving the stripping data from the data preparing unit 100 and controlling the peripheral devices; an original film transport device 352 connected to the control unit 359; a base sheet carrier 320; a vacuum channel device 365 of a stripping table; an adhesive tape attaching portion 321; and a base sheet tray 305.

The control unit 359 comprises: a CPU 360 for executing a program for controlling the operation of the stripping unit 300; a RAM 361 connected to the CPU 360 for storing the stripping data and the like; a ROM 362 connected to the CPU 360 for storing the program and the like executed by the CPU 360; and an interface 363 for connecting the CPU 360 to the peripheral devices.

The operation of the intermediate original sheet forming apparatus according to the above described embodiment will now be described.

(A) First, the data preparing procedures in the data preparing unit 100 will be described.

(1) Preparation of Layout Data

A plurality of layout conditions are assigned job numbers and stored in advance in the microcomputer 101 of the data preparing unit 100. When the operator designates a job number by using the keyboard 102, a desired layout condition is read from the storing portion in the microcomputer 101. Alternatively, the operator may input directly necessary layout conditions to be used through the keyboard 102 or a menu sheet of the digitizer 103.

Figure 13:
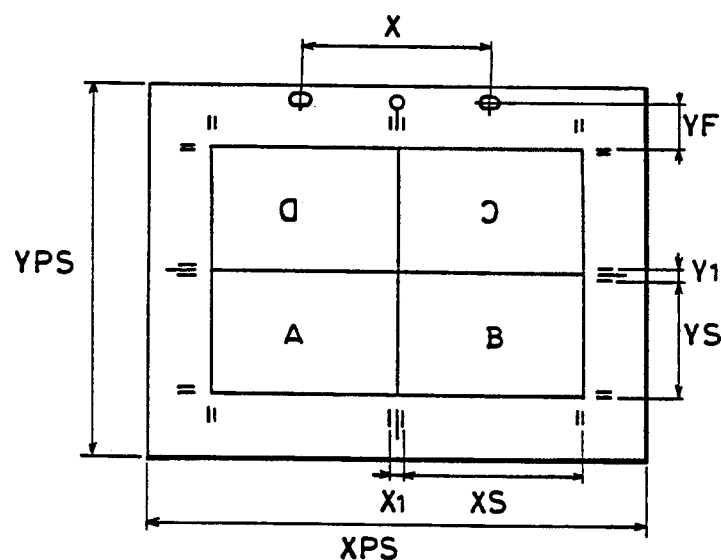
FIG. 13 is a plan view of a base sheet showing a layout of original films on the base sheet, as displayed on a CRT (Cathode-Ray Tube) display in a data preparing unit in the embodiment of the invention.

For example, when the operator inputs "JOB NUMBER 100" through the keyboard 102, the layout conditions corresponding to this job number (the layout conditions for stripping of four pages in this example) are read out. The layout shown in FIG. 13 is displayed on the CRT 104. In FIG. 13, XPS and YPS represent a base sheet size; X represents a spacing of register holes of the base sheet; YF represents a gripper margin; X1 and Y1 represent gutter sizes; and XS and YS represent an original film size. The layout conditions include other data such as the position and direction of an original film of each page on the base sheet, the numbers (XP, YP) of areas for stripping original films in the X and Y directions, and the number of repetitions of stripping operation (for example four for Y, M, C and Bk in the case of color printing).

Characters A, B, C and D for example are displayed on the display screen as shown in FIG. 13 so that the pages can be distinguished from each other. Among those pages, the pages to be stripped upside down (C and D in FIG. 13) are displayed upside down so that the operator can pay attention thereto.

(2) Preparation of Original Film Data

Data of the respective original films A, B, C and D are inputted by the digitizer 103.

The original film data include the positions of the register marks, the positions (shown by the hatched areas in the figure) where tapes for stripping are attached, the positions of register holes, and the like. The positions of the register marks are defined by the centers of the three register marks (e.g., RM1, RM3 and RM4) other than the register mark (RM2 in FIG. 14) existing on the side where the register holes will be opened. The register holes are used in common for the respective original films and the diameter of each register hole, the spacing of the holes and the distance from the image to each hole are determined in advance. Thus, the positions of the register holes are defined as any of the head, the tail, the right and the left (in this example, the tail) of each page.

Individual job numbers are assigned to the respective data of the original films A, B, C and D (for example, "JOB NO 100-A" is assigned to the data of the original film A).

In the case of stripping for four colors, if the sizes of the original films of the respective colors are the same, layout data for only one color, for example, Y original film data may be inputted and the repetition for the other colors is not required.

It should be noted that the sensors for detecting the register marks provided in the punching/cutting unit 200 preferably correspond to the shapes of the register marks (for instance, the shapes of minus signs, plus signs, or full circles).

(3) Composition of Data

Referring to FIG. 5, the microcomputer 101 composes the register marks RM of the respective original films, the adhesive tapes T and the register holes H in a layout area based on the original film data and displays the composition on the CRT 104.

(4) Transmission of Data

When the necessary data are prepared, the data preparing unit 100 transmits the data to the film punching/cutting unit 200 and the original film stripping unit 300.

The data of the register mark positions, the register hole positions and the cut positions of the side portions, which are assigned the job numbers, are transmitted to the film punching/cutting unit 200.

The individual data of the respective original films such as the base sheet size, the base sheet registering hole positions, the number of repetitions of stripping, the original film stripping positions and the tape attaching positions are assigned job numbers and transmitted to the original film stripping unit 300.

(B) Operation of the film punching/cutting unit 200 will be described with reference to FIGS. 6 to 11.

(1) Reading of Original Film Data

The punching/cutting data transmitted from the data preparing unit 100 to the film punching/cutting unit 200 is stored in the RAM 202. The operator designates a job number (for example "JOB NO 100-A") of an original film to be punched and cut, by using the operation panel 209. The punching/cutting data of the corresponding original film is read from the RAM 202.

(2) Movement of the Sensors

The operator depresses the start button (not shown) on the operation panel 209. Referring to FIG. 9, the pulse motors 237 of the register mark detecting devices 206A, 206B and 206C are driven based on the read register mark position data, so that the respective optical sensors 234 are set in the positions corresponding to the register marks.

(3) Setting of an Original Film

The first original film to be punched and cut is placed by the operator in a predetermined start position on the glass table 204. The original film OF is placed on the gauge mark GM so that the three register marks RM of the film OF fall into the respective three arms of the thick letter of T.

(4) Vacuum Contact of the Original Film

Referring again to FIG. 8, when the start button (not shown) is depressed again, the pulse motors 215 and 223 of the transport device 205 are operated so that the vacuum head 226 is moved to the start position. The air cylinder 229 is compressed, so that the vacuum head 226 is lowered and holds the original film. When the original film is held, the air cylinder 229 is restored and the head 226 is elevated while holding the original film.

(5) Movement of the Original Film to the Registration Area

When the pulse motors 215 and 223 are driven, the held original moves to the registration area where the register mark detecting devices 206A, 206B and 206C are set (this registration area is an area where the register marks of the original film are nearly coincident with the positions of the optical sensors 234 of the detecting devices 206A, 206B and 206C).

(6) Registration of the Original Film

When the original film is moved to the registration area, the head 226 is lowered. The pulse motors 215, 223 and 231 of the transport device 205 operate so that the register marks of the original film coincide with the respective centers of the optical sensors 234 of the detecting devices 206A, 206B and 206C. Thus, the positions and direction of the original film on the glass table 204, namely, the position in the X direction, the position in the Y direction and the angle around the central axis of the rod 225 are defined. The light sources 257 apply sufficient light to enable the optical sensors 234 to detect the register marks.

Various methods have been proposed as to detection of the register marks and registration (for example in Japanese Patent Laying-Open Nos. 55-33145, 55-33146, 62-206403). Any method considered to be suitable can be adopted according to the number or the form (for example, the shapes of the plus signs or the minus signs) of the register marks.

In this embodiment, each of the optical sensors 234 in this embodiment includes two light receiving elements 234A and 234B having light receiving surfaces perpendicular to each other, as shown in FIG. 16. The light receiving elements 234A and 234B output detection signals in response to the light incident on their light receiving surfaces. The detection signals are converted to digital signals by an A/D converter (not shown) and the digital signals are applied to the CPU 201.

The CPU 201 drives the pulse motors 215, 223 and 231 according to differentials of the detection signals so as to define the position and direction of the vacuum head 226. The register mark RM shown in FIG. 17(c) is in a predetermined position. If the register mark RM deviates leftward as shown in (a) of FIG. 17, the CPU 201 drives the pulse motors 215, 223 and 231 to move the vacuum head 226 rightward, whereby the register mark RM is moved as shown in (c) of FIG. 17. If the register mark RM deviates rightward as shown in (b) of FIG. 17, the CPU 201 moves the vacuum head 226 leftward so that the register mark RM is moved to the position shown in (c) of FIG. 17.

(7) Setting of Punching Positions of the Original Film

After the registration of the original film, the head 226 is elevated. Referring to FIG. 18($a$), the CPU 201 rotates the head 226 for each unit of 90° based on the punching position data. A side portion of the original film to be punched is set on the rear side of the glass table 204. Then, the CPU 201 moves the head 226 toward the punching device 207 and inserts the side portion of the original film to be punched into the gap 267 of the punching device 207.

(8) Punching of the Original Film

After the original film is set in the predetermined position, the CPU 201 rotates the motor 245 by 360°. The cam shaft 242 and the eccentric cam 243 fixed thereto rotate once around the corresponding axis of the cam shaft 242, thereby depressing the heads of the punches 240. Referring to FIG. 18(b), two holes for registration are formed in predetermined positions of the original film by means of the punches 240.

(9) Positioning of the Original Film for Cutting of Unnecessary Portions

After the holes are formed in the original film, the CPU 201 drives the air cylinder 229 to elevate the head 226 together with the original film. The CPU 201 drives the pulse motor 231 and rotates the head 226 for each unit of 90° based on the cutting position data. When the side portion of the original film to be cut is positioned on the side of the cutting device 208, the CPU 201 stops the pulse motor 231. The CPU 201 drives the pulse motor 223 to rotate the screw shaft 220, so that the head arm 218 is retracted toward the member 213. The side portion to be cut of the original film held by the head 226 is inserted into the gap 267 by a predetermined dimension.

(10) Cutting of Unnecessary Portions of the Original Film

An end of one side of the original film projects over the die 238 toward the cutting device 208. The CPU 201 expands the pair of air cylinders 247 and lowers the presser plate 246 so that the original film inserted between the die 238 and the presser plate 246 is fixed. The CPU 201 operates the motor 255. According to the rotation of the motor 255, the rotating cutter 253 rotates and moves along the rack 248. The projecting portion of the original film over the die 238 is cut off by the rotating cutter 253. The manner of cutting the unnecessary portion is shown in 18(c). The cut unnecessary portion of the original film is discharged from the gap between the die 238 and the base plate 250.

Referring to FIG. 18(d), if there are a plurality of unnecessary side portions to be cut, the operations described above in (9) and (10) are repeated the necessary number of times.

(11) Discharge of the Punched and Cut Original Film

After the holes are formed in the original film and the unnecessary portions are cut off, the CPU 201 compresses the air cylinders 247 and elevates the presser plate 246. The CPU 201 expands the air cylinder 229. The rod 225 is elevated by the attachment 228. The original film released from the presser plate 246 is moved upward together with the head 226. The CPU 201 drives the pulse motors 215 and 223, whereby the original film is transported to a predetermined position on the glass table 204 by means of the head 226 and it is released from the suction of the head 226 and placed thereon.

(C) Stripping of the Original Film on the Base Sheet (1) Reading of Stripping Data Now, referring to FIGS. 12 to 12A, the stripping data transmitted from the data preparing unit 100 to the original film stripping unit 300 is stored in the RAM 361 in the stripping unit 300. The operator designates a job number of original films to be stripped, so that stripping data are read from the RAM 361.

(2) Initial Positioning of Original Films

The original films processed by the film punching-/cutting unit 200 are placed by the operator on the set table 301 of the stripping unit 300. The pins 302 are inserted in the holes of the original films and thus the original films are initially positioned.

(3) Preparation of a Base Sheet

At the time of taking out a base sheet from the supplying portion 303, the tray 305 is located at a position elevated by a motor (not shown), according to the instructions of the CPU 360. The CPU 360 drives the motor 311 to rotate the shaft 310 so that the cross girder 308 is moved over the supplying portion 303. The CPU 360 lowers the base sheet carrier 320. The carrier 320 holds a base sheet.

The CPU 360 rotates the motor 311 in the reverse direction so that the cross girder 308 is moved over the table 306. The cross girder 308 stops when the register holes of the base sheet reach the positions of the pins 307. The CPU 360 lowers the carrier 320 to release the base sheet so that the base sheet is placed in a predetermined position on the table 306. The CPU 360 operates the vacuum channel device 365 so that the base sheet is held on the table 306.

Since the positional relations between the pins 304 and the pins 307 are defined in advance, the moving amount of the cross girder 308 at the time of transporting a base sheet is precisely defined.

(4) Attachment of Adhesive Tapes to Original Films

The CPU 360 issues an instruction to the transport device 352 to move the head 317 over the table 301. The CPU 360 operates the transport device 352 to lower the head 317. When the head 317 absorbs and holds the original film, the CPU 360 moves the head 317 upward. The transport device 352 transports the original film to the tape supplying portion 321. The CPU 360 rotates the head 317 for each unit of 90° based on the data read from the RAM 361 and sets the tape attaching positions of the original film over the tape supplying portion 321. The CPU 360 drives the tape supplying portion 321 to supply a double-adhesive tape of each predetermined length to each predetermined position of the lower surface of the original film.

(5) Stripping of the Original Film

The original film to which the adhesive tapes are attached is transported to a predetermined position on the table 306 by the transport device 352 based on the stripping position data. The CPU 360 drives the motor 319 based on the stripping data and rotates the original film stepwise by the angle of 90° around the axis of the rod 316. The original film with its head being directed toward the predetermined position is mounted on the base sheet by lowering of the head 317.

The above-described operations of (1) to (5) are repeated, whereby all the original films of the related pages are mounted on the base sheet.

(6) Discharge of the Base Sheet

After all the original films are mounted on the base sheet, the CPU 360 stops the vacuum channel device 365. The released base sheet is held by the carrier 320 and transported toward the tray 305. The tray 305 is lowered in advance. The base sheet is released from the carrier 320 and stacked on the tray 305.

If four printing sheets are to be prepared for full color printing, the base sheets for the other colors are transported from the supplying portion 303 to the table 306 by the transport device 352 and the above described stripping operations of (1) to (6) are repeated.

According to the present invention, the original film punching/cutting unit 200 and the original stripping unit 300 carry out stripping operations for the respective color printing sheets based on single layout data prepared by the data preparing unit 100. Consequently, there is a very little deviation of the original films for the respective printing processes compared with the manual system in the prior art. In addition, once a layout is defined, the operation for stripping original films on a base sheet according to the layout is carried out electro-mechanically and errors in work such as setting of the mounting directions, or cutting of unnecessary portions can be remarkably decreased. Furthermore, since register holes are formed in each original film before the register marks are cut off, an original film having many portions cut can be stripped accurately.

In the apparatus of this embodiment, arrangements of standardized original films are limited to typical several layouts and stored in advance. Consequently, a layout can be designated with a very simple operation. In addition, there is little error in designation of a direction of a head or tail of each original film. There is a further advantage that an inexperienced operator can easily designate position data.

SECOND EMBODIMENT

Figure 19:
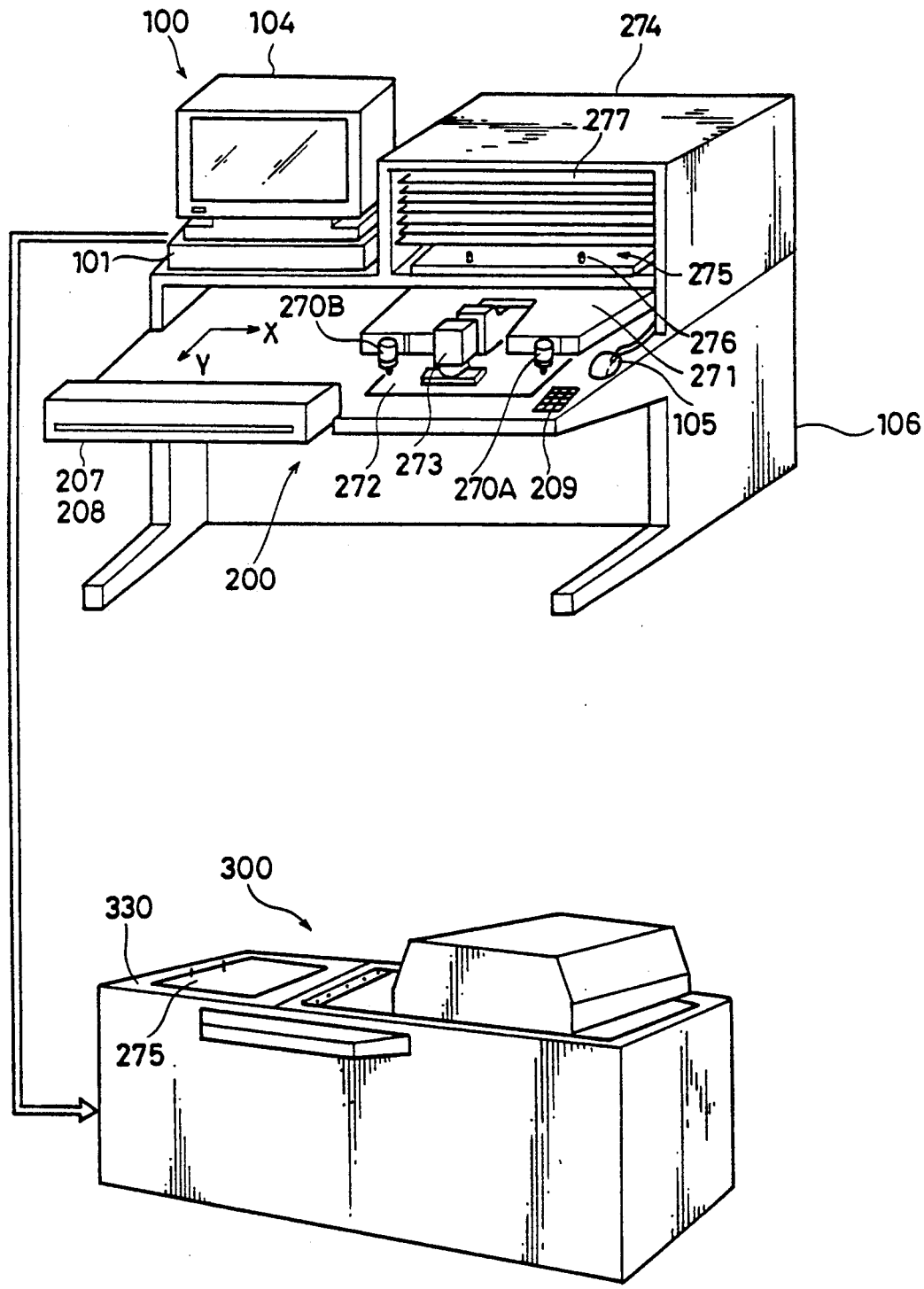
FIG. 19 is a perspective view of an intermediate original sheet forming apparatus according to another embodiment of the invention.

Referring now to FIG. 19, a structure of an intermediate original sheet forming apparatus according to the second embodiment of the invention will be described in the following. In FIG. 19, the components identical or corresponding to those in the first embodiment shown in FIGS. 5 to 12A are indicated by the same characters or names as in the first embodiment. Accordingly, the detailed description thereof is not repeated.

Referring to FIG. 19, this apparatus comprises a data preparing unit 100; an original film punching/cutting unit 200; and an original film stripping unit 300.

The data preparing unit 100 comprises: a microcomputer 101; a mouse 105 for inputting data or instructions to the microcomputer 101; and a CRT 104 for displaying necessary information and messages selected by the microcomputer 101. The mouse 105 is input means equivalent to the keyboard 102 and the digitizer 103 in the first embodiment.

The punching/cutting unit 200 comprises: a desk 106; a movable base 271 provided on a top plate of the desk 106; an original film transport device 273 provided at a front central portion of the movable base 271; a lighted table 272 provided under the transport device 273 at the center of the top plate; three register mark detecting devices 270A, 270B and 270C (not shown) provided on right and left sides and a rear side of the movable base 271 and under the rear portion of the lighted table 272; a punching device 207 and a cutting device 208 provided on a left front side of the top plate; a lighted table 272 provided under the transport device 273 at the center of the top plate; and a film storing portion 274 provided on the top plate.

The film storing portion 274 has a plurality of racks 277 for storing original films. A space for storing a film cassette 275 is provided in the lowest stage of the film storing portion 274. On the upper surface of the film cassette 275 stand pins 276 for aligning a plurality of stacked original films.

The original film stripping unit 300 is the same as that in the first embodiment, except that the unit of the second embodiment has a cassette fixing portion 330 on its upper surface, to which a film cassette 275 is fixed.

Referring to FIG. 19, operation of the apparatus according to the second embodiment will be described.

(1) Preparation of Data in the Data Preparing Unit 100

Job numbers to be selected are displayed in advance in a menu form on the CRT 104. The operator manipulates the mouse 105 on the top plate of the desk 106 to move a cursor on the screen of the CRT 104. When the cursor is in a desired position, the operator instructs the microcomputer 101 to read a command by depressing a button (not shown) provided on the mouse 105. The microcomputer 101 detects the position of the cursor and examines the command or the job number indicated by the cursor. The microcomputer 101 reads layout conditions corresponding to the designated job number from a fixed disk (not shown) or ROM 362 for example and displays the layout conditions on the screen of the CRT 104.

Alternatively, desired layout conditions may be set directly by using the mouse 105 in the same manner as in the first embodiment.

Figure 14:
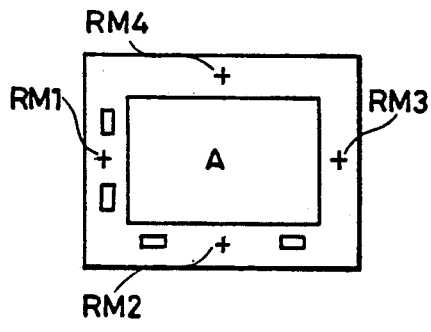
FIG. 14 is a plan view of an original film showing original film data prepared in the data preparing unit in the preferred embodiment of the invention.
Figure 15:
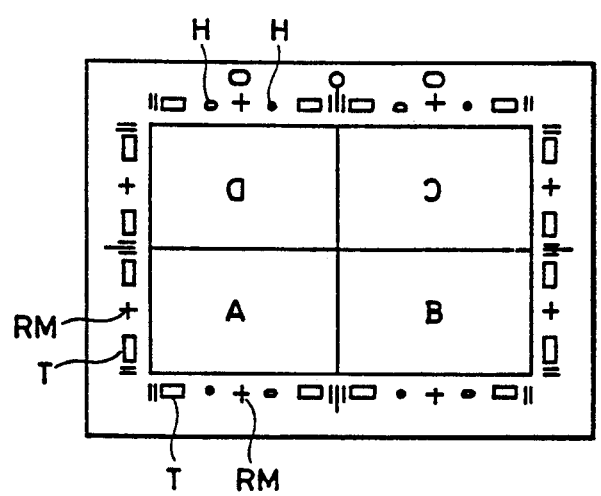
FIG. 15 is a plan view of a base sheet showing a layout of original films represented in a composite manner on a CRT display in the data preparing unit of the preferred embodiment of the invention.

Original film data as shown in FIG. 14, namely, the positions of the register marks, the positions of tapes and positions of register holes are inputted by means of the mouse 105. According to this second embodiment, the distance between the register marks RM1 and RM3 and the distance between the register marks RM2 and RM4 shown in FIG. 14 are inputted as the register mark position data.

The positions of tapes are designated appropriately by using the mouse 105 by the operator, taking account of positional relations between the original sizes XS and YS and the register mark positions displayed on the screen of CRT 104.

Figure 20:
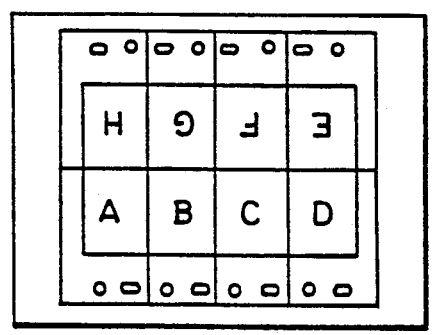
FIG. 20 is a plan view of a base sheet showing schematically an arrangement of original films on the base sheet and an arrangement of register holes formed in the original films in the case of printing eight pages on one printing sheet.

The positions of the register holes are designated in the same manner as in the first embodiment. Those positions may be automatically set based on the layout data. For example, referring to FIG. 20, the positions of the register holes in a layout for eight pages can be automatically set at the head or the tail of the layout.

Figure 21A:
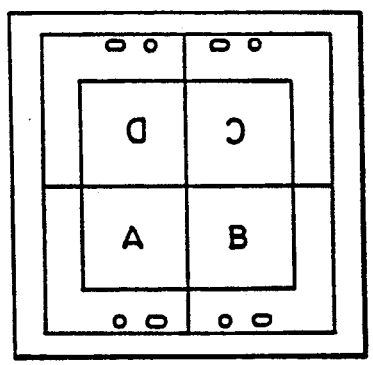
FIG. 21 (a) and (b) represents plan views of a base sheet showing a layout of original films and positions of register holes in the case of printing four pages on one printing sheet.
Figure 21B:
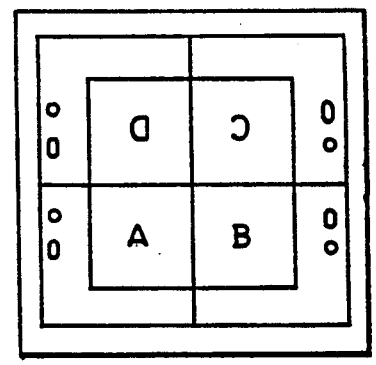

In the case of a layout for four pages as shown in FIG. 21, the positions of the register holes can be automatically selected on the head and tail sides (as shown in (a) of FIG. 21) or on the right and left sides (as shown in (b) of FIG. 21). Those positions may be selected by the operator.

(2) Operation of the Film Punching/Cutting Unit 200

The optical sensors 270A, 270B and 270C are located in initial positions based on the register mark position data supplied from the data preparing unit 100, in the same manner as in the first embodiment. The operator places an original film in a predetermined position on the lighted table 272. When the operator depresses the start button (not shown) of the operation panel 209, the movable base 271 together with the transport device 273 moves over the lighted table 272.

When the movable base 271 and the transport device 273 come over the original film, they are caused to stop. The head of the transport device 273 lowers and holds the original film by vacuum suction. As described above in the first embodiment with reference to FIG. 17, the optical sensors 270A, 270B and 270C (not shown) detect the register marks of the original film.

In response to output signals of the optical sensors 270A, 270B and 270C, the original film and the optical sensors are moved in the following manner. The position of the original film in the direction shown by the arrow Y and the angle around an axis vertical to the lighted table 272 are adjusted by the transport device 273. Positional deviation between the original film and the optical sensors in the direction shown by the arrow X is compensated by movement of the optical sensors 270A and 270B in the X direction.

After the original film is positioned correctly, the transport device 273 transports the original film to the punching device 207. The punching device 207 punches the original film in predetermined positions and the cutting device 208 cuts off unnecessary portions of the original film.

The original film thus punched and cut is stacked on the original cassette 275 by the operator. The stacked original films are aligned to a common edge by insertion of the common pins 276 into the holes of the original films.

(3) Operation of the Original Film Stripping Unit 300

The original cassette 275 with original films stacked on it is supplied to the cassette fixing portion 330 of the stripping unit 300. Original films are taken out from the cassette fixing portion 330 by the head and stripped one by one in the designated positions on the base sheet in the same manner as in the first embodiment.

A plurality of original films are, in this apparatus of the second embodiment too, stripped accurately and rapidly in predetermined positions of the base sheet.

THIRD EMBODIMENT

In the above described embodiments, the original films are all of a standard size, and each film has only one image formed upon it. In some cases, however, two images are formed on a double size film. For example, in proof-reading which requires a proof copy printed as closely as possible to an actual book, an original film with two images formed upon it might be prepared for the convenience of easy printing and verifying of the correctness, content and quality of the proof copy.

Referring to FIG. 26A, there is illustrated a double size original film with an image on it to be printed as a spread covering two pages. Referring to FIG. 26B, there is given another illustration of a double size film with an image of pages 2 and 3 upon it. This kind of arrangement is utilized for facilitating the proof-reading. Thus, in some cases in actual printing of a book, two types of original films, i.e., a standard size film with an image of a page on it and a double size film with an image of two pages, are prepared to be stripped on the base sheet. In this third embodiment, an apparatus capable of handling two types and sizes of original films will be described.

Hereinafter, printing of a book of 32 pages is described as an example. FIGS. 27A to 27D illustrate the arrangement of the pages on the printing sheets. The book is made of two signatures SG1 and SG2 (shown in FIG. 28) side-stitched together, each of which is a printing sheet folded three times, comprised of 16 pages.

FIG. 27A shows the arrangement of the pages on one surface of the printing sheet to be the signature SG1. FIG. 27B shows the page arrangement on the reverse side. FIG. 27C shows the arrangement of the pages on one surface of the printing sheet to be the signature SG2. FIG. 27C shows the page arrangement on the reverse side.

The first and second signatures SG1 and SG2 are printed by the same process. In the following, the stripping operation for obtaining an intermediate original film for making the signature SG1 will be described. As is already described, some of the films supplied to the stripping operation have an image of two serial pages formed upon it. The other films each have an image of only a single page formed thereon. For instance, the first film has the image of the first page formed upon it, whereas the second film (which is twice as large as the first one) has the image of pages 2 and 3 upon it, followed by the third film on which the image of the fourth page is formed, and so forth.

The standard size films can be easily handled by employing the method described in the first or the second embodiment. The double size films, however, have to be divided into two pieces in ordinary cases each of which has an image of a page upon it. Each piece should be stripped in an appropriate position on the base sheet separately.

In preparation of the positioning data, two kinds of information about the original films have to be inputted and modified independently. One is about the standard size film, and the other is about the double size film. The information contains the size of the film and the image, the positions of the register marks, and the positions of the register holes to be formed upon the film.

For this embodiment, however, the apparatus of the second embodiment can be employed with only a slight modification. The description of the modification will be given later.

Preferably, the original films of the pages constituting one signature should be processed in a continual operation of the punching/cutting unit 200. In the case of the signature shown in FIGS. 27A and 27B, 16 pages at most should be provided at a time. Too many films will cause any adverse effect on the operation or the handling of the operator.

Figure 22:
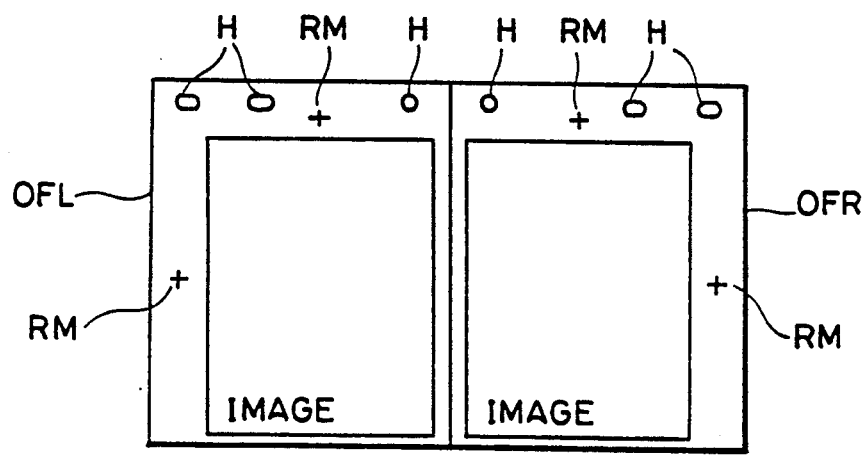
FIG. 22 represents a schematic plan view of a pair of the original films showing an arrangement of the register holes of an embodiment of the present invention.

Referring to FIG. 22, there is disclosed an arrangement of the register holes formed on the original films. In this embodiment, each pair of the original films are stripped in on the base sheet at a time, to be adjacent to each other. This is for the purpose of obtaining swifter operation.

For instance, the original films OFL and OFR are to be adjacent to each other in a manner shown by FIG. 22. Three register holes H are formed on each original film. Their arrangement, however, is different from each other of the pair.

Accordingly, the holes will be formed by the punching device 207A in an arrangement shown in FIG. 22. The punching device 207A is characterized in that it can form register holes at a time on a double size film or two standard size films provided side by side.

Figure 32:
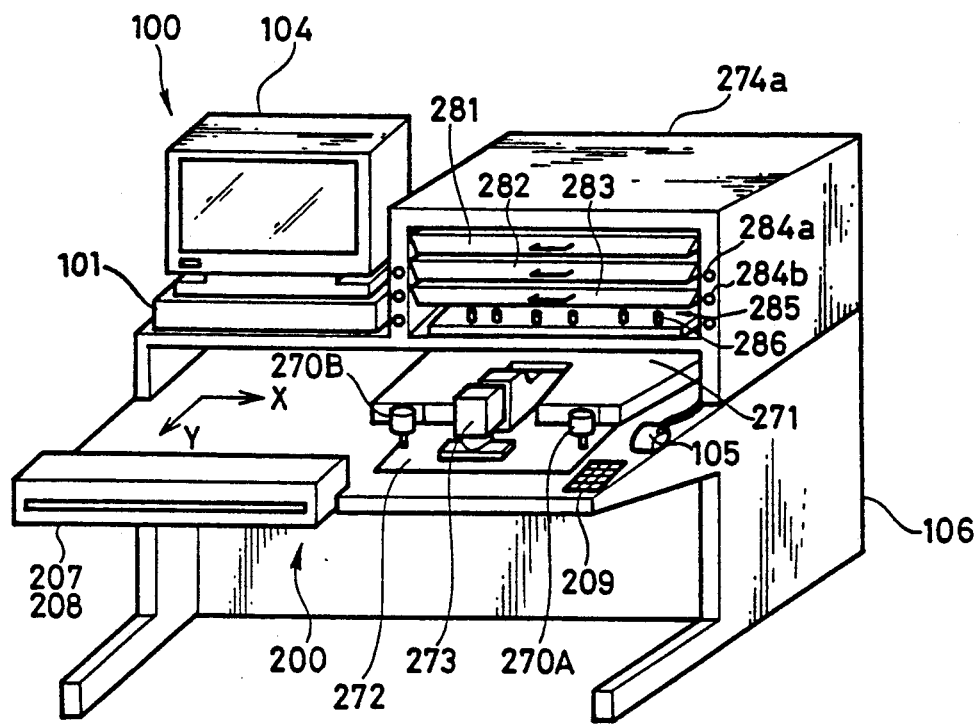
FIG. 32 is a perspective view of an apparatus according to a third embodiment of the present invention.
Figure 33:
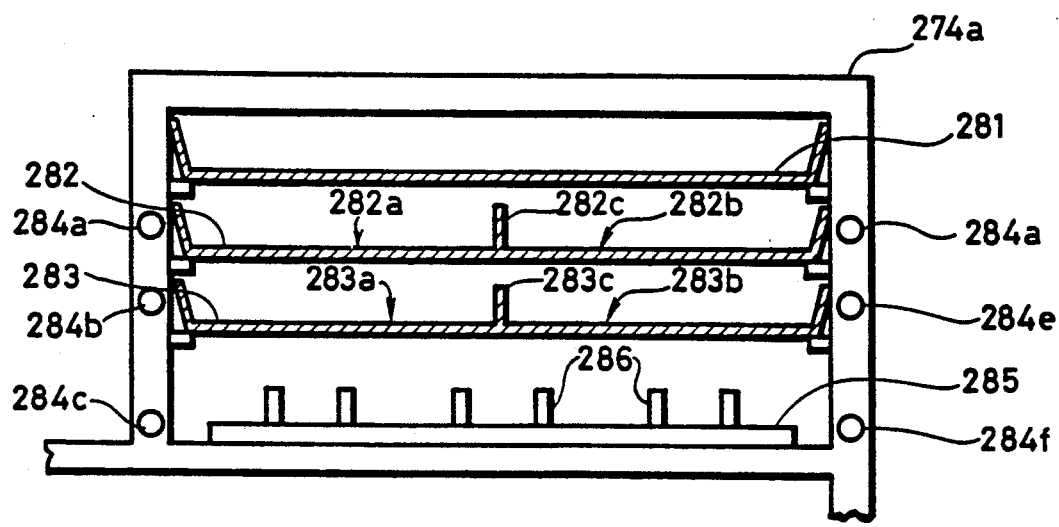
FIG. 33 shows a partially sectional front view of a film storing portion of the apparatus.

Referring to FIGS. 32 and 33, the apparatus in this embodiment comprises a data preparing unit 100, an original film punching/cutting unit 200, and an original film stripping unit (not shown). The unit 100 and the stripping unit of this embodiment are identical with the unit 100 and the unit 300 of the first and second embodiments, respectively. The detailed description, therefore, is not repeated.

The original film punching/cutting unit 200 is almost identical with that shown in FIG. 19, except for a slight modification. The modification includes the film storing portion 274a. The other portions of the unit 200 identical with those shown in FIG. 19 are indicated by the same reference numerals or names in the second embodiment.

The portion 274a comprises: an original film storing pallet 281 for storing the original films to be supplied to the punching device 207 and the cutting device 208; cut film storing pallets 282 and 283 for temporarily storing the original films punched and cut by the devices 207 and 208; an original film cassette 285 provided in the lowest stage of the portion 207 for storing a plurality of films stacked upon it to be transferred to the film stripping unit. On the front end of the portion 274a, there are provided six LEDs 284a to 284e for indicating where the films are to be stored.

The bottom of the pallet 282 is divided into two portions 282a and 282b by the partition 282c. The pallet 283 is also divided into two portions 283a and 283b by the partition 283c. The LEDs 284a, 284b, 284c, 284d, 284e and 284f are provided near the bottom portions 282a and 283a, the left side of the cassette 285, the portions 282b and 283b and the right side of the cassette 285, respectively.

In the following, the operation of the original film punching/cutting unit 200 will be described. Original films for the first printing sheet are stacked beforehand on the pallet 281. The next page number according to the page sequence will appear on the display screen of the CRT 104. The page sequence is also designated in advance in the data preparing unit 100.

For instance, when the next sequence is to process page 5, a massage "Page 5 or Pages 4 and 5?" appears on the screen of the CRT 104. If the original film with the image of page 5 is of a standard size, the page 5 will be selected by the operator. Otherwise, the pages 4 and 5 will be selected. In the following, operation with a double size film will be described.

This selection gives information on the kind and the size of the film to the CPU 201 (refer to FIG. 7) so that the subsequent operation can be correctly applied. When the standard size is designated, the film will be cut in a manner similar to the operation described in the first and the second embodiments. It should be noted that in the case of punching the standard size original film, only the punches on the right or left side are used.

Figure 23:
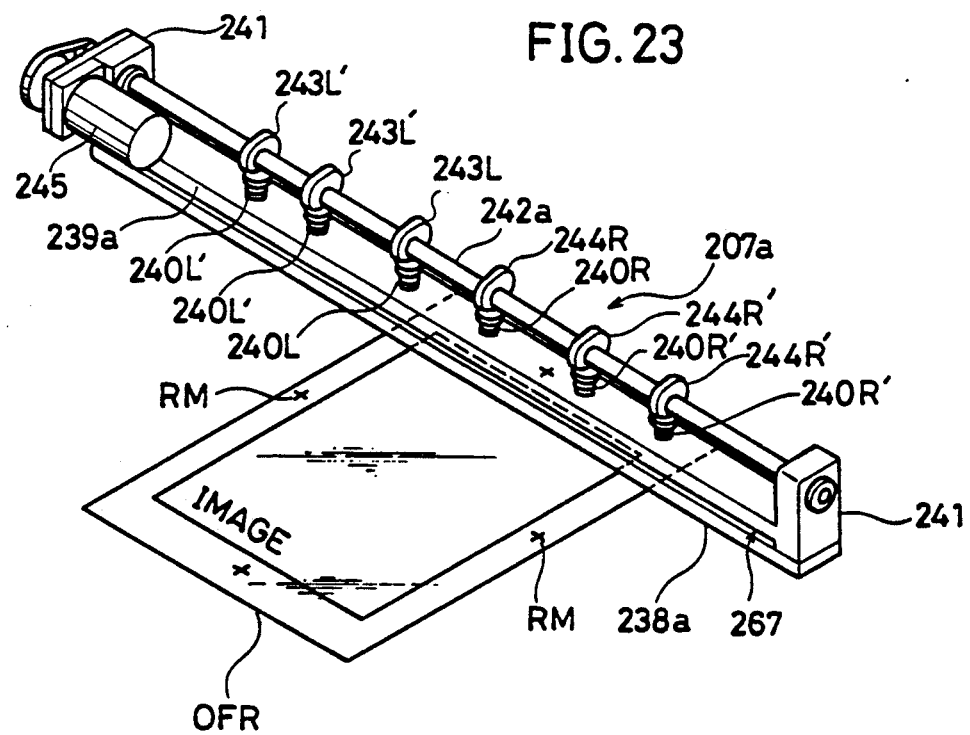
FIG. 23 is a perspective view of a part of the punching device utilized in an embodiment of the present invention.

In the punching/cutting unit 200 of this embodiment, a punching device 207A shown by FIG. 23 is employed instead of the device 207 of FIG. 10. Referring to FIG. 23, the punching device 23 includes a camshaft 242a with six eccentric cams, a die 239 with six through holes, a punch guide 239a disposed in parallel to the die 238 with a gap 267, three right-side punches 240R, 240R', three left-side punches 240L, 240L'. The camshaft 242a has the six eccentric cams 244R, 244R', 243L, 243L' located upon the respective punches 240R, 240R', 240L, 240L'.

The identical elements in FIG. 10 and FIG. 23 are given the same reference numerals. The detailed description of their structures and functions, therefore, is not to be repeated here. It is already given related to the first embodiment.

Figure 29A:
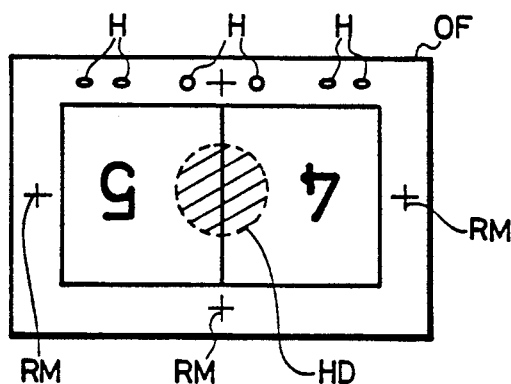
FIGS. 29A to 29E show plan views of a the double size original film in its various stages of punching and cutting.
Figure 29B:
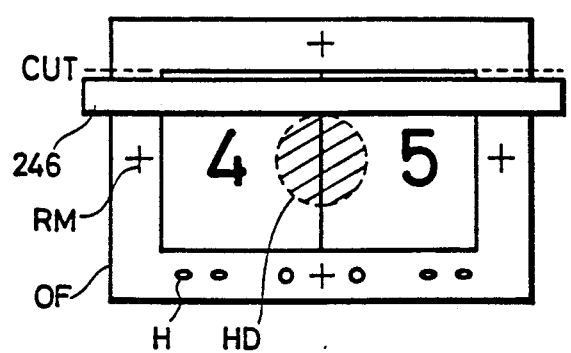
Figure 29C:
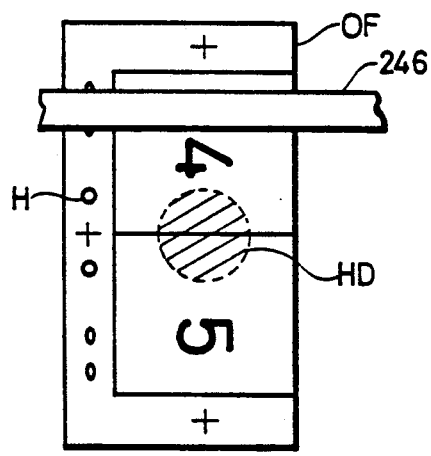
Figure 29D:
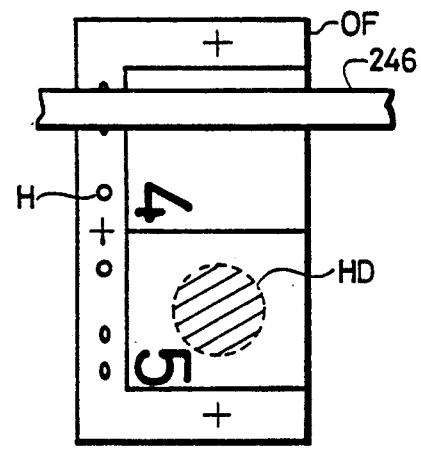
Figure 29E:
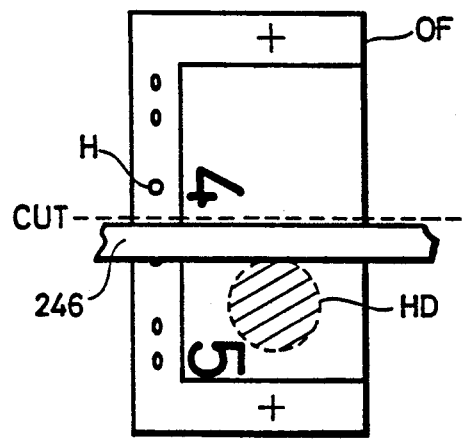

Operation in the case of selecting a double size film will be described. Referring to FIG. 29A, images of pages 4 and 5 are formed adjacent to each other on the film OF, thereby constituting a spread image. Those two pages need to be stripped individually on the base sheet as shown in FIG. 27A. The original film OF is held by the vacuum head 273 (as shown in FIG. 32) in a hatched region.

i) Six register holes H are punched on the film OF. This punching is carried out by using six punches 240L', 240L' 240L, 240R, 240R' and 240R'. In this case, those register holes are formed on the tail side of the original film OF.

ii) The original film OF having the six register holes H is placed in a position where unnecessary portions are to be cut, while it is held by the head 273 (as shown in FIG. 32). A cutter, not shown, cuts off the unnecessary portions while a presser plate 246 presses the film OF. Referring to FIG. 29B, the head of the film is cut off.

iii) FIGS. 29C to 29E show procedures for cutting pages 4 and 5 apart. First of all, the original film OF is positioned so that the boundary between pages 4 and 5 may be parallel with the presser plate 246. The presser plate 246 presses the film OF. The absorption of the film OF by the vacuum head (not shown) is temporarily stopped.

iv) Referring to FIG. 27D, the vacuum head (not shown) temporarily releases the film and moves a little to be located at the center of the page 5. The vacuum head (not shown) absorbs again the film OF, making it possible to cut pages 4 and 5 apart. In the meantime, the presser plate 246 presses the film OF and accordingly the position of the film OF does not deviate.

v) The vacuum head (not shown) moves toward the presser plate 246 and transports the film OF to a position suited for cutting of pages 4 and 5. While the presser plate 246 presses the film OF, the cutter, not shown, cuts the film OF at the boundary of pages 4 and 5.

In some cases, dependent on the arrangement of images of the pages on the printing sheet, it is not necessary to cut the two pages apart. This applies for instance in the cases of pages 8 and 9 in FIG. 27A and pages 24 and 25 in FIG. 27C. In those cases, it is not needed to cut the boundary of the two pages.

The original films OF separated for each page as required and having the register holes with the unnecessary portions thereof being cut off are stacked on the film cassette.

When the original film OFR on the right of the pair is punched, it is inserted to the right half of the gap 267. With a rotation of the camshaft 242a, three register holes are formed in the film OFR by the punches 240R, 240R'. The original film OFL on the left is inserted to the left half of the gap 267 to get punched.

Figure 30:
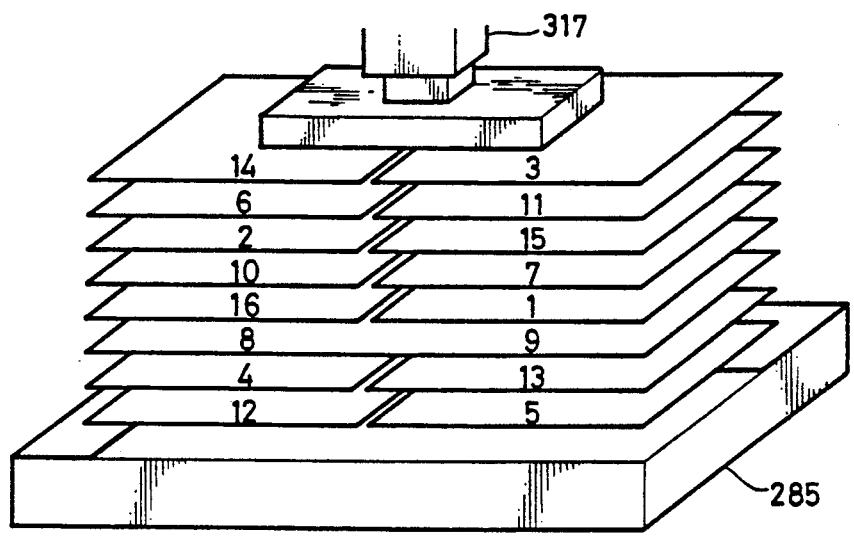
FIG. 30 illustrates a perspective view schematically showing a plurality of films stacked on a cassette side-by-side.

The original films are stacked on the cassette 285 in a predetermined order. FIG. 30 shows an example in which pages 5, 13, 9, 1, 7, 15, 11 and 3 are stacked in this order on the right side and pages 12, 4, 8, 16, 10, 2, 6 and 14 are stacked in this order on the left side. Pages 8 and 9 are not separated in this example. This method of stacking corresponds to the stripping orders shown in FIGS. 31A and 31B.

Figure 31A:
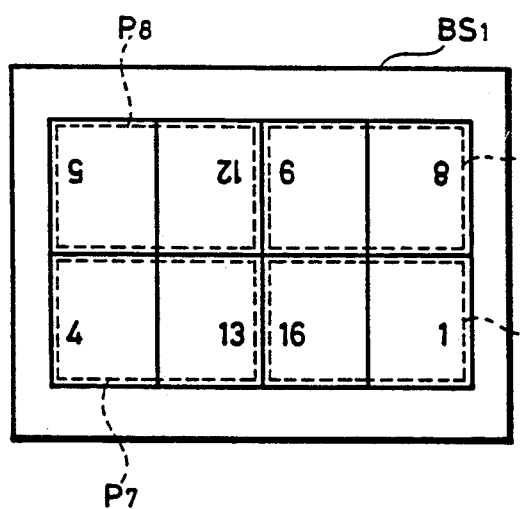
FIGS. 31A and 31B are schematic plan views of the two sides of a base sheet.
Figure 31B:
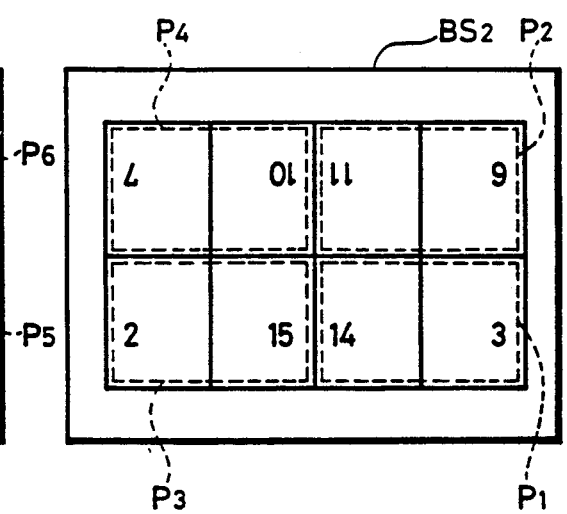

Referring to FIGS. 31A and 31B, the first base sheet BS1 is used for printing the front surface of the first printing sheet. The second base sheet BS2 is used for printing the reverse surface thereof. The original films on the base sheet BS2 are divided into four pairs P1, P2, P3 and P4. The pair P1 includes pages 14 and 3; the pair P2 includes pages 6 and 11; the pair P3 includes pages 2 and 15; and the pair P4 includes pages 10 and 7. Similarly, original films on the base sheet BS1 are divided into four pairs P5, P6, P7 and P8. The pairs P5 P6, P7 and P8 include pages 16 and 1, pages 8 and 9, pages 4 and 13, and pages 12 and 5, respectively. Stripping of the base sheets BS2 and BS1 is carried out in the order named.

Stripping of the pairs P1, P2, P3 and P4 on the base sheet BS2 is carried out by the head 317 in the order named. Stripping of the pairs P5, P6, P7 and P8 on the base sheet BS1 is carried out in the order named. Comparing FIG. 30 with FIGS. 31A and 31B, it will be confirmed that the order of stacking of the respective original films correctly corresponds to the stripping orders.

The work for stacking correctly the original films for 16 pages as shown in FIG. 30 is troublesome although there are not so many pages. The device 200 of this third embodiment includes a mechanism for facilitating the stacking of the original films on the cassette 285. In the following, the procedures for stacking the original films on the cassette 285 will be described.

Figure 34A:
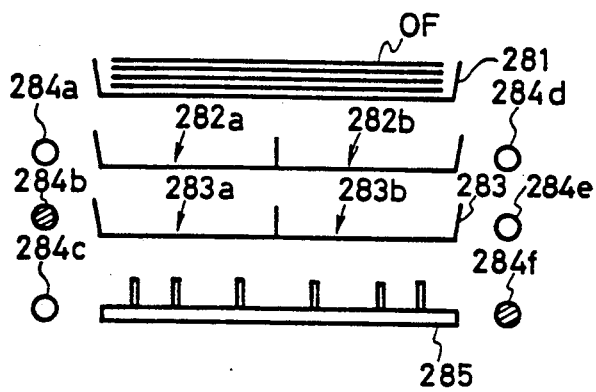
FIGS. 34A to 34F are schematic sectional views of the film storing portion, with its side and top panels not illustrated.

Referring to FIG. 34A, original films OF necessary for preparing a signature are stacked in advance on the pallet 281. The operator takes out an original film corresponding to the page displayed on the screen of the CRT 104 (as shown in FIG. 32). The film is punched and cut by the devices 207 and 208 to be separated into two original films. When this operation is terminated, the CPU 201 (as shown in FIG. 7) blinks the LEDs 284b and 284f. The operator stores or sets the separated original films in the pallet or cassette instructed by the blinking LEDs (i.e., the left portion 283a of the pallet 283 and the right portion of the cassette 285 in the case of FIG. 34A).

Figure 34B:
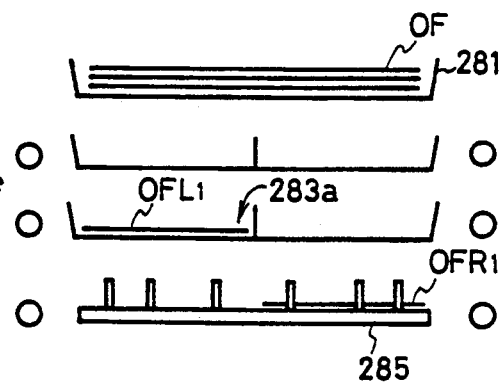

Referring to FIG. 34B, the operator sets the right original film OFR1 on the right side of the cassette 285 and stores the left original film OFL1 in the pallet 283a. When the operator sets the next original film OF in a predetermined start position and depresses a start button (not shown), the LEDs stop blinking. Punching-/cutting operation for the set film is started.

Figure 34C:
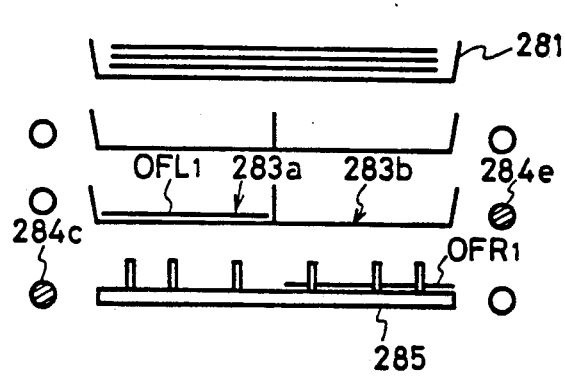

Referring to FIG. 34C, after the film OF has been punched and cut, the CPU 201 blinks the LEDs 284c and 284e this time. The operator sets the separated original films in the positions instructed by the blinking LEDs, namely, in the pallet 283b and on the left portion of the cassette 285.

Figure 34D:
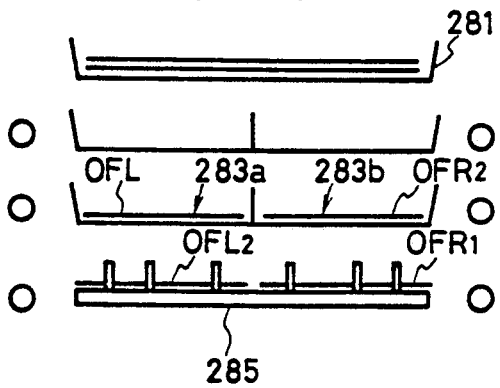

Referring to FIG. 34D, the films OFL2 and OFR1 are set adjacent to each other on the cassette 285 by the above-described operation The films OFL1 and OFR2 are stored in the pallets 283a and 283b, respectively. The operator places the next original film OF in the predetermined start position and depresses the start button not shown.

Figure 34E:
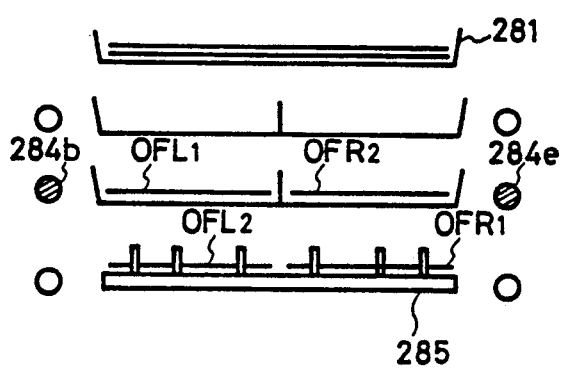
Figure 34F:
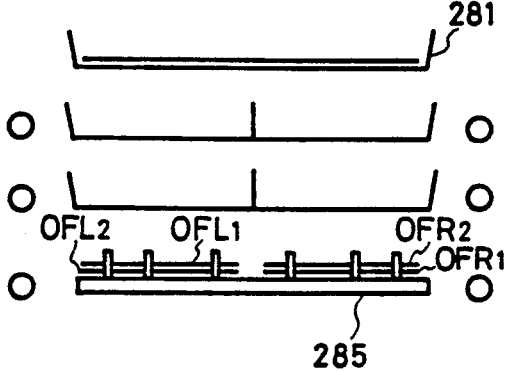

Referring to FIG. 34E, the CPU 201 does not immediately start punching and cutting of the set original film this time. The CPU 201 lights, instead, the LEDs 284b and 284e, to prompt the operator to set the films OFL1 and OFR2 in the right and left portions of the cassette 285.

In the above-described example, a blinking LED indicates that the operator should put the film into the corresponding pallet. A lighted LED indicates that the operator should take out the film from the corresponding pallet.

When the operator sets the films OFL1 and OFR2 on the cassette 285 and depresses again the start button, punching and cutting of the previously set original film are started.
image of page 4 is formed on the film OFL1; the image of page 5 is formed on the film OFR1; the image of page 12 is formed on the film OFL2; and the image of page 13 is formed on the film OFR2. Accordingly, the stacking of the films shown in FIG. 30 can be confirmed.

By repeating the same procedures, the original films necessary for stripping on the two base sheets BS1 and BS2 are stacked on the cassette 285. Then, the cassette 285 is set on the stripping unit 300 so as to be used in stripping operation. Since the stripping operation is automatically carried out, the operator can prepare by using the unit 200 the original films necessary for preparing the subsequent signature (pages 17 to 32 in FIGS. 27C and 27D).

In the above-described operation, the films stacked on the right side of the cassette 285 and those stacked on the left side thereof have different arrangements of punched holes (as shown in FIG. 29A). Accordingly, the films are not erroneously set. As for the LEDs for indicating the storing or setting of films, one LED is provided for each of the right and left portions of each pallet or cassette. However, two LEDs of green and red for instance may be provided for each pallet to indicate storing and taking out of films. In addition, a message for instructing movement of films may be displayed on the screen of the CRT 104.

Stripping of films on the base sheet is carried out in the following manner.

Figure 24:
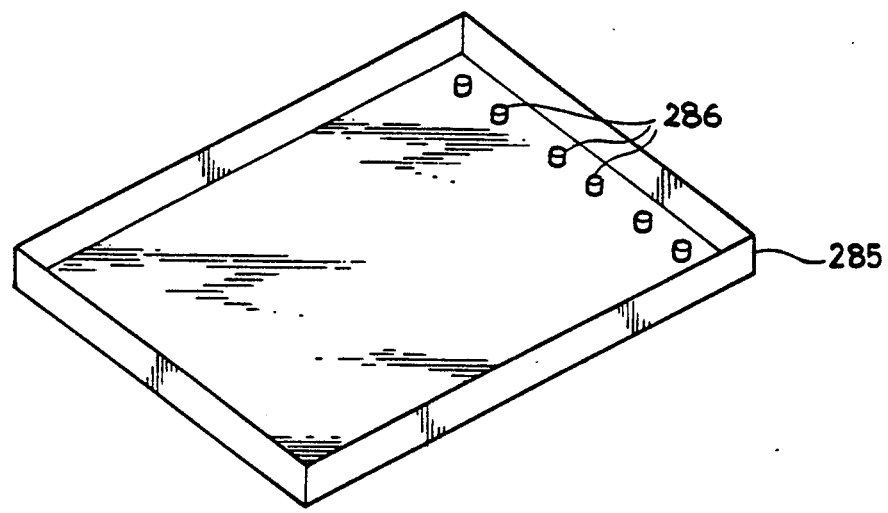
FIG. 24 is a perspective view of an original film cassette employed in an embodiment of the present invention.

Referring to FIG. 24, there is illustrated a film cassette 285 utilized in this embodiment on which inner bottom stand six register pins 286. The arrangement of the pins 286 corresponds to that of the register holes H shown in FIG. 22.

Figure 25:
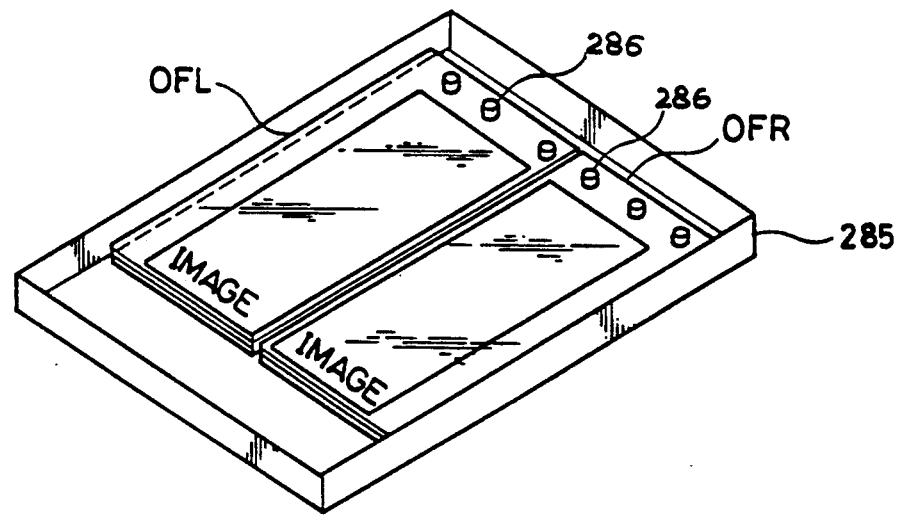
FIG. 25 is a perspective view of an original film cassette loaded with the pairs of the original films.

After being punched and the unnecessary portions being cut off, the original films are mounted on the cassette 285. Referring to FIG. 25, the right ones of the pairs of the original films are stacked and aligned to the three register pins on the right side of the bottom. The left ones OFL are stacked and aligned to the three holes on the left.

In the above-described third embodiment, different original films for adjacent two pages are stripped at a time on the base sheet. If a gutter margin is required between the respective pages, it is necessary to prepare a cassette having an arrangement of pins with additive spacing thereof taking account of the gutter margin. Although movable pins may be provided on the cassette, a sufficient precision cannot be expected in such a case. Consequently, it is desirable to prepare a plurality of types of cassettes corresponding to a plurality of gutter margins.

In the stripping operation, each pair of the original films, consisting of the left one OFL and the right one OFR, is held and transported by the head 317 (refer to FIG. 12) at a time, to be stripped in on the base sheet. In this manner, each pair of the original films, which are to be printed side by side, can be stripped at the same time.

In addition, by using the cassette capable of containing a plurality of films, successive stripping operations are performed automatically. Once the cassette 285 is mounted on the unit 300 and the start button is depressed, there is no need of the operator's intervention as to the setting of the films, thereby leaving on large block of time at the operator's disposal.

The above-described third embodiment is related with the case of preparing a side-stitched book. However, the present invention is applicable to the cases of preparing saddle-stitched books. In the case of saddle-stitched books, there are various combinations of arrangements of pages and the numbers of pages. Accordingly the operation becomes a little complicated because of frequent occurrence of temporary storing of original films to be cut and so forth. However, it goes without saying that by using the above described apparatus, intermediate original sheets can be formed much more easily and promptly compared with manual operation.

In this embodiment too, consequently, an effective, time and man-power saving stripping operation can be obtained. As is apparent to those skilled in the art, the stripping unit 300 utilizing the cassette 285 is also applicable to the films of smaller sizes. In such cases, only the inner pins are to be used to hold the films.

The above-described embodiments are indicated by way of example only and the present invention is not limited thereto. The present invention is applicable to many variants as described below.

The film punching/cutting unit 200 according to the above described embodiments punches an original film and then cuts unnecessary side portions of the film. However, another example may be adopted in which side portions of an original film are cut at first and then the original film is punched.

In the above described embodiments, the operator sets an original film in the film punching/cutting unit 200 and the original film stripping unit 300. However, a device for automatically setting an original film in the respective units may be adopted.

According to the above described embodiments, the positions of the register holes and the spacing thereof are fixed. However, those positions and spacing may be changed in the data preparing unit 100 for example. In such a case, the punching device 207 will have a somewhat complicated structure. The accuracy of stripping is however, is stable and independent of changes of sizes of original films.

Although preferred embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. An apparatus, for forming an intermediate original sheet suitable for use in a photomechanical printing process by affixing at predetermined positions on a base sheet a plurality of original films of a common size and form that are prepared individually, comprising:
    means for receiving, storing and processing input data including predetermined information concerning said original films and for designating data relating to a layout of said original films on said base sheet;
    position data output means for evaluating and outputting position data relating to respective positions of said original films with respect to said base sheet based on said information and said layout data;
    register hole forming means for forming register holes in said original films for defining said positions for the respective original films based on said position data;
    original film cutting means for cutting a respective predetermined portion of a peripheral area of each of said original films, based on said information and said position data;
    registering means for determining respective positions of said plurality of original films on said base sheet based on said position data; and
    means for fixing said original films in said determined positions on said base sheet.

2. An intermediate original sheet forming apparatus in accordance with claim 1, wherein:
    said input means comprises layout storing means for storing a plurality of predetermined layouts of said plurality of original films and layout selecting means for selecting one of said plurality of layouts.

3. An intermediate original sheet forming apparatus in accordance with claim 2, wherein:
    said input means further comprises layout modifying means for modifying said selected layout.

4. An intermediate original sheet forming apparatus in accordance with claim 1, wherein:
    said position data comprises,
    stripping position data for defining a position relating to said affixing of each of said original films on said base sheet,
    registration hole position data for forming a plurality of register holes in each of said original films for defining a position thereof, and
    cutting position data for cutting portions said predetermined of said peripheral areas of each of said original films.

5. An intermediate original sheet forming apparatus in accordance with claim 1, wherein:
    said register holes are formed in predetermined positions of a peripheral area of each of said original films, based on said position data, prior to any of said cutting of said original films.

6. An apparatus in accordance with claim 1, wherein:
    said registering means comprises a mounting table having a plurality of register pins mounted thereto, for mounting and stacking of said original films on said mounting table with said register pins being inserted into corresponding ones of said register holes in said original films, and
    transport means for sequentially transporting said original films from said mounting table to said base sheet.

7. An apparatus in accordance with claim 6, wherein:
    said mounting table is formed to enable mounting thereon of two decks of said original films, said two decks being disposed parallel to each other, and said transport means transports said original films from said mounting table to said base sheet one pair at a time, one sheet of each of said pair being transported from a respective one of said two decks.

8. A method for forming an intermediate original sheet suitable for use in a photomechanical printing process utilizing a plurality of original films disposed in predetermined positions on a base sheet, comprising the steps of:
    inputting predetermined information concerning said original films, to means for receiving, storing and processing the same, said information including a designated layout of said original films on said base sheet;
    evaluating and outputting position data relating to respective positions of said original films with respect to said base sheet, based on said information and said layout designations previously inputted;
    forming register holes in said original films for thereby defining respective positions for the respective original films based on said position data;
    cutting a respective predetermined portion of a peripheral area of each of said original films, based on said information and said position data;
    determining respective positions for said original films on said base sheet, based on said position data; and
    fixing said original films in said determined positions on said base sheet.

9. A method in accordance with claim 8, wherein:
    said information inputting step comprises the steps of storing a plurality of predetermined layouts of said plurality of original films, and selecting one of said plurality of layouts.

10. A method in accordance with claim 9, wherein: said information inputting step comprises the further step of modifying said selected layout.

11. A method in accordance with claim 8, wherein: said position data comprises stripping position data for defining a position relating to said affixing of each of said original films on said base sheet, registration hole position data for forming a plurality of register holes in each of said original films for defining a position thereof, and cutting said predetermined portions of said peripheral areas of each of said original films.

12. A method in accordance with claim 8, wherein: said register holes are formed in predetermined positions of a peripheral area of each of said original films, based on said position data relating thereto, prior to said cutting of said original films.

13. A method in accordance with claim 8, comprising the further steps of:
mounting and stacking said original films on a surface of a mounting table with said register holes in said original films receiving register pins mounted to said mounting table in predetermined positions; and
sequentially transporting said original films from said mounting table to said base sheet.

14. A method in accordance with claim 13, wherein: said mounting table is formed to enable mounting thereon of two decks of said original films so that said two decks are disposed parallel to each other, and said step of transporting said original films comprises transportation of said original films from said mounting table to said base sheet one pair at a time with one sheet of each of said pairs being transported from a respective one of said two decks.

* * * * *